(12) United States Patent
Saegusa et al.

(10) Patent No.: US 12,068,275 B2
(45) Date of Patent: Aug. 20, 2024

(54) DIE BONDING APPARATUS AND MANUFACTURING METHOD FOR SEMICONDUCTOR DEVICE

(71) Applicant: Fasford Technology Co., Ltd., Yamanashi (JP)

(72) Inventors: Ryo Saegusa, Minami-Alps (JP); Masayuki Mochizuki, Minami-Alps (JP); Keita Yamamoto, Minami-Alps (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 485 days.

(21) Appl. No.: 17/399,272

(22) Filed: Aug. 11, 2021

(65) Prior Publication Data
US 2022/0052017 A1     Feb. 17, 2022

(30) Foreign Application Priority Data

Aug. 12, 2020  (JP) .................................. 2020-136096
Jun. 8, 2021   (JP) .................................. 2021-096125

(51) Int. Cl.
*H01L 23/00*     (2006.01)
*H01L 21/687*    (2006.01)

(52) U.S. Cl.
CPC ........ *H01L 24/75* (2013.01); *H01L 21/68764* (2013.01); *H01L 2224/75702* (2013.01)

(58) Field of Classification Search
CPC ............... H01L 24/75; H01L 21/68764; H01L 2224/75702; H01L 21/6836; H01L 24/29; H01L 24/32; H01L 24/48; H01L 24/83; H01L 24/85; H01L 24/92; H01L 24/94; H01L 2224/2741; H01L 24/27; H01L 24/95; H01L 2221/68336; H01L 2224/27003; H01L 2224/27436; H01L 2224/2919; H01L 2224/32225; H01L 2224/45144; H01L 2224/48227; H01L 2224/73265; H01L 2224/75704;
(Continued)

(56) References Cited

U.S. PATENT DOCUMENTS 5,876,556 A * 3/1999 Takanami ......... H01L 21/67144
                                                      29/831
6,176,966 B1 * 1/2001 Tsujimoto ......... H01L 21/67132
                                                     156/707
(Continued)

FOREIGN PATENT DOCUMENTS

JP   2013-179206 A   9/2013
JP   2015-173551 A   10/2015

*Primary Examiner* — David Luo
(74) *Attorney, Agent, or Firm* — Crowell & Moring LLP

(57) ABSTRACT

A die bonding apparatus includes: a driven body; and a table for driving the driven body. The table includes: a base; a linear motor having a first mover that moves the driven body, and a stator; a first linear motion guide that is provided between the base and the stator and capable of freely moving the stator; a second linear motion guide that is provided between the base and the first mover and capable of freely moving the first mover; a second mover provided in the form of being fixed to the base; and a control device for controlling the first mover and the second mover. The control device is configured to move the stator along the first linear motion guide using the second mover.

19 Claims, 19 Drawing Sheets

(58) Field of Classification Search
CPC . H01L 2224/75745; H01L 2224/75753; H01L 2224/75804; H01L 2224/75824; H01L 2224/75901; H01L 2224/75925; H01L 2224/7598; H01L 2224/75981; H01L 2224/83132; H01L 2224/92; H01L 2224/92247; H01L 2224/94; H01L 2224/95; H01L 2924/181; H01L 21/67276; H01L 21/67144; H01L 21/67742; H01L 21/52; H01L 21/67253; H01L 21/67259; H01L 21/67721; H05K 13/0408
USPC .................................................. 318/38, 34
See application file for complete search history.

(56) References Cited

U.S. PATENT DOCUMENTS

| | | | |
|---|---|---|---|
| 8,460,491 B1 * | 6/2013 | Fukasawa | H01L 21/67144 156/367 |
| 9,324,679 B2 * | 4/2016 | Ishii | H01L 24/75 |
| 2013/0221764 A1 | 8/2013 | Ishii et al. | |

* cited by examiner

DIE BONDING APPARATUS AND MANUFACTURING METHOD FOR SEMICONDUCTOR DEVICE

CLAIM OF PRIORITY

The present application claims priority from Japanese patent applications JP2020-136096 filed on Aug. 12, 2020 and JP2021-96125 filed on Jun. 8, 2021, the contents of which are hereby incorporated by reference into this application.

BACKGROUND

The present disclosure relates to die bonding apparatuses, and the present disclosure can be applied to a die bonding apparatus equipped with, for example, a counterreaction absorption mechanism.

As one of semiconductor manufacturing apparatuses, there is a die bonding apparatus such as a die bonder used for bonding semiconductor chips call dice to substrates such as wiring substrates or lead frames. In the die bonder, a bonding head picks up a die by vacuum suction, moves up at a high speed, moves horizontally, and moves down to mount the die on a substrate.

Both high precision and high speed of a die bonder are required, and especially high speed of a bonding head, which is the heart of the die bonder, is strongly required. Generally speaking, the larger the speed of an apparatus is made, the larger the vibration of the apparatus grows due to its high speed movement.

As a counterreaction absorption device for reducing this vibration, there is a device disclosed by, for example, Japanese Unexamined Patent Application Publication No. 2013-179206. Japanese Unexamined Patent Application Publication No. 2013-179206 discloses a technology in which a linear motor is used for the drive axis of the bonding head of a die bonder, a fixed integration section including a fixed magnet section is made to move freely as a counterweight, and a movable integration section including the bonding head and the fixed integration section move in synchronization with each other, so that a vibration is reduced.

SUMMARY

The structure of the die bonder in which the fixed integration section (stator) is freely moved in accordance with the counterreaction of the movable integration section (mover) is proposed in a technology disclosed in Japanese Unexamined Patent Application Publication No. 2013-179206, but it is difficult to finely control the operation of the die bonder in order to reduce the vibration in the case of such a structure.

The challenge of the present disclosure is how to provide a die bonding apparatus in which the vibration of its own can be reduced more effectively.

The outline of a typical die bonding apparatus included in the present disclosure is described as follows. To put it concretely, the die bonding apparatus includes: a driven body; and a table for driving the driven body. The table includes: a base; a linear motor having a first mover that moves the driven body, and a stator; a first linear motion guide that is provided between the base and the stator and capable of freely moving the stator; a second linear motion guide that is provided between the base and the first mover and capable of freely moving the first mover; a second mover provided in the form of being fixed to the base; and a control device for controlling the first mover and the second mover. The control device is configured to move the stator along the first linear motion guide using the second mover.

The above-described die bonding apparatus can more effectively reduce the vibration of its own.

DESCRIPTION OF THE PREFERRED EMBODIMENTS

Figure 1:
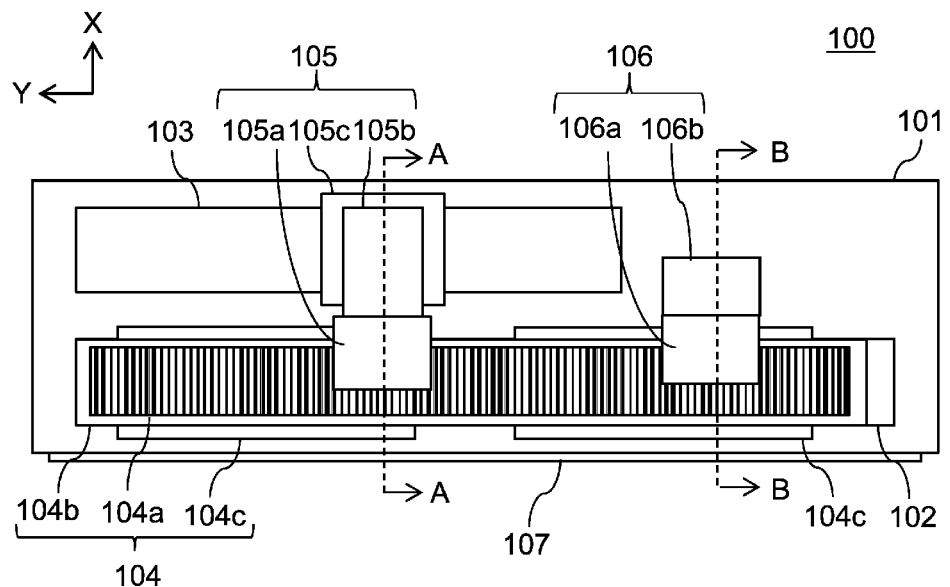
FIG. 1 is a top view of a table according to an embodiment.

Hereinafter, an embodiment, modifications, and examples will be explained with reference to the accompanying drawings. Here, in the following descriptions, the same components are given the same reference signs, and redundant explanations about the same components will be omitted in some cases. Furthermore, there are some cases where, in order to make the descriptions clearer, the widths, thicknesses, shapes, and the like of respective portions of the embodiment, the modifications, and the examples are schematically depicted differently from what those really are in the drawings, but these depictions show only schematic examples, so that the interpretation of the present disclosure is not limited to these depictions.

Figure 2:
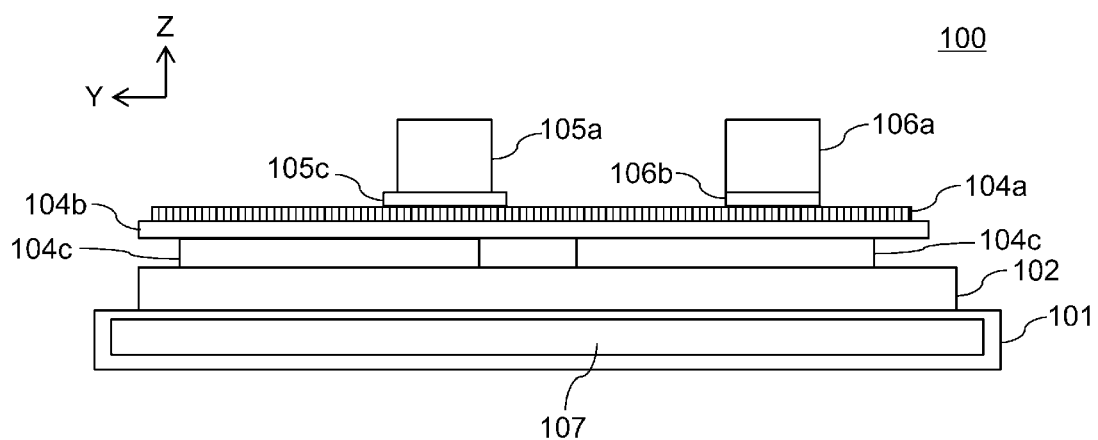
FIG. 2 is a front view of the table shown in FIG. 1.
Figure 3:
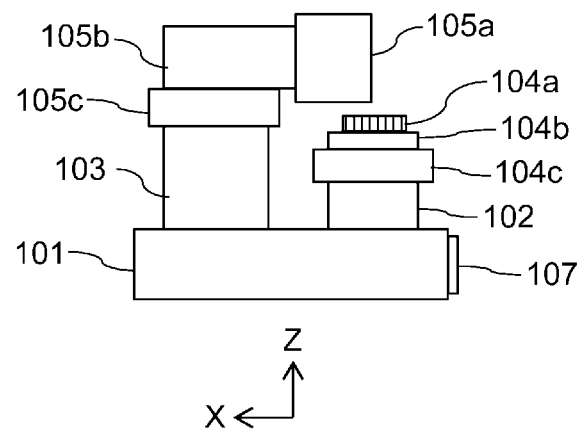
FIG. 3 is a cross-sectional view taken along the line A-A shown in FIG. 1.
Figure 4:
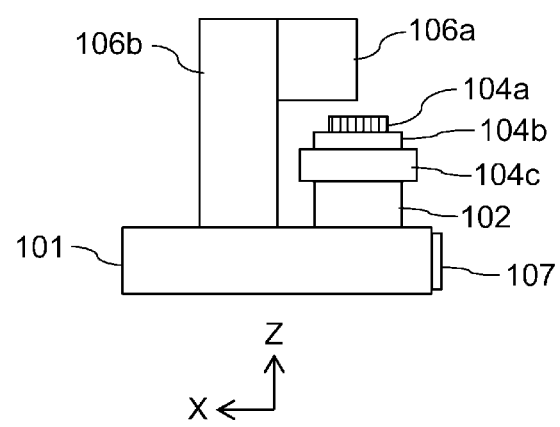
FIG. 4 is a cross-sectional view taken along the line B-B shown in FIG. 1.
Figure 5:
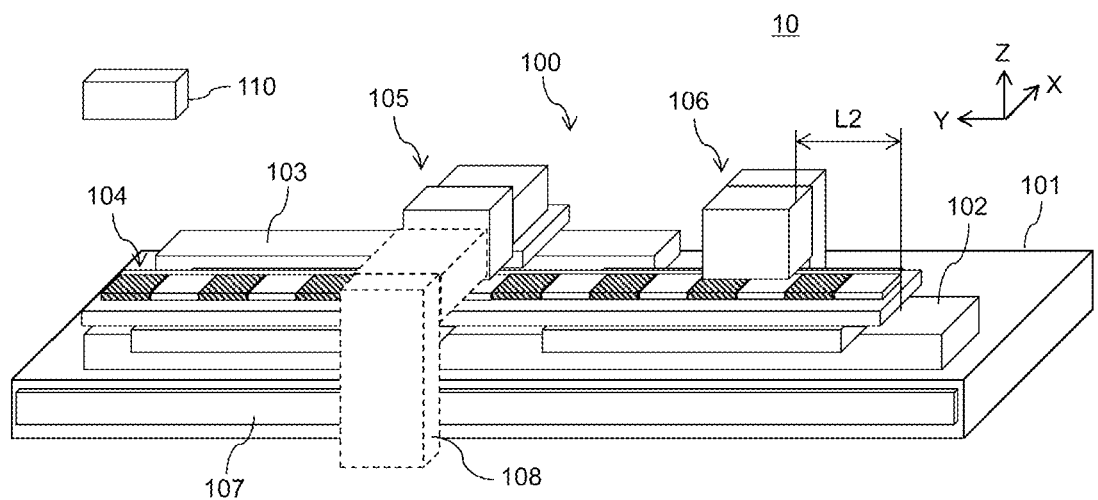
FIG. 5 is a perspective view of the table according to the embodiment.

The configuration of a table according to the embodiment will be explained with reference to FIG. 1 to FIG. 5. FIG. 1 is a top view of the table according to the embodiment. FIG. 2 is a front view of the table shown in FIG. 1. FIG. 3 is a cross-sectional view taken along the line A-A shown in FIG. 1. FIG. 4 is a cross-sectional view taken along the line B-B shown in FIG. 1. FIG. 5 is a perspective view of a die bonding apparatus having the table shown in FIG. 1 in a state where a first mover has not been moved yet.

In a table 100 according to the embodiment, a linear motor is used as a drive source. The table 100 includes: a base 101; a first linear motion guide 102 installed on the base 101; a second linear motion guide 103 installed on the base 101 in parallel with the first linear motion guide 102; and a stator 104 installed on the first linear motion guide 102. The base 101 is fixed to the pedestal (not shown) of a die bonder 10. The first linear motion guide 102 and the second linear motion guide 103 extend in the Y axis direction. The length of the first linear motion guide 102 is set longer than that of the second linear motion guide 103.

The stator 104 includes: a magnet section 104a having plural permanent magnets that are arranged in such a way that the N poles and S poles of the respective permanent magnets are alternately disposed in the Y axis direction; a flat-plate yoke 104b for combining the magnetic fluxes of plural combinations of neighboring permanent magnets among the plural permanent magnets; and a first linear motion slider 104c that moves on the first linear motion guide 102. The magnet section 104a is installed on the upper surface of the yoke 104b, and the first liner motion slider 104c is installed on the lower surface of the yoke 104b.

The table 100 further includes a first mover 105 and a second mover 106 installed on the stator 104. The first mover 105 includes: a coil section 105a; a support member 105b that supports the coil section 105a; and a second linear motion slider 105c that moves on the second linear motion guide 103. The coil section 105a includes a coil and a core that generate a magnetic flux, and a yoke that combines fluxes neighboring one another, and composes an electromagnet. The support member 105b is installed on the second linear motion slider 105c. The first mover 105 can freely move on the second linear motion guide 103.

The second mover 106 includes a coil section 106a and a support member 106b that supports the coil section 106a. The configuration of the coil section 106a is the same as that of the coil section 105a. The support member 106b is installed on the base 101. The second mover 106 is fixed to the base 101 and set immovable.

Each of the lengths of the first mover 105 (coil section 105a) and the second mover 106 (coil section 106a) in the Y axis direction is shorter than the length of the stator 104 (magnet section 104a) in the Y axis direction. The sum of the lengths of the first mover 105 (coil section 105a) and the second mover 106 (coil section 106a) in the Y axis direction is shorter than the length of the stator 104 (magnet section 104a) in the Y axis direction.

As shown in FIG. 5, a driven body 108 is connected to the first mover 105. The driven body 108 is, for example, a Z drive axis that drives a bonding head up and down and the like. The driven body 108 includes the bonding head too.

In addition, the table 100 includes a scale 107 installed so as to cover almost the entire range of the base 101 in the Y axis direction. The scale 107 and, for example, an optical detection sensor (not shown) installed in the driven body 108 compose a linear sensor. The linear sensor detects the position of the driven body 108 in the Y axis direction, and transfer control for transferring the driven body 108 to a target position such as position control or speed control is performed on the basis of an output of this linear sensor. With this, it becomes possible, for example, that the first mover 105 is controlled using a control method described in Japanese Unexamined Patent Application Publication No. 2015-173551. The contents of Japanese Unexamined Patent Application Publication No. 2015-173551 are hereby incorporated by reference into this application.

The operation of the table 100 is controlled by a control device 110. In other words, the control device 110 controls the operation of the table 100 by driving an I/O device or an actuator connected to a network in order to control currents flowing through the coils of the first mover 105 and the second mover 106.

Figure 6:
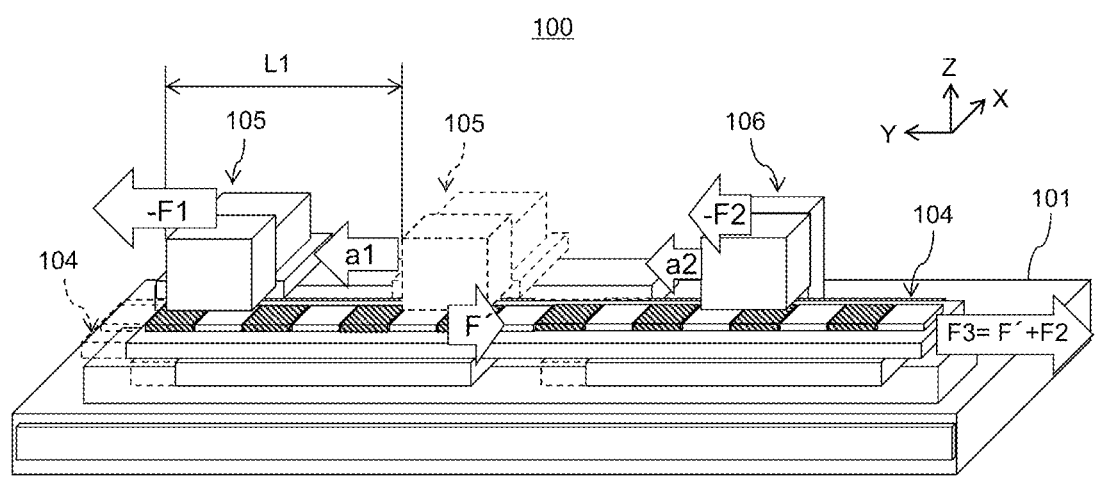
FIG. 6 is a perspective view of the table shown in FIG. 5 used for explaining the counterreaction absorption operation of the table.

The counterreaction absorption operation of the table according to the embodiment will be explained with reference to FIG. 6. FIG. 6 is a perspective view used for explaining the counterreaction absorption operation of the table shown in FIG. 5.

The control device 110 virtually moves the second mover 106 in the same direction as a direction in which the first mover 105 is moved (the Y axis direction) in parallel with the movement of the first mover 105. Here, the second mover 106 is fixed to the base 101, so that the second mover 106 cannot be moved. Actually, under the assumption that the second mover is not fixed, flowing a current through the coil of the second mover 106 so that the second mover 106 is moved is referred to as virtually moving the second mover 106.

Here, the mass of the first mover 105 is represented by m1; the mass of the stator 104 by m2; the acceleration of the first mover 105, by a1; the acceleration of the second mover 106, by a2, the acceleration of the stator 104, by a3; a thrust force acting on the first mover 105, by F1; a thrust force acting on the second mover 106, by F2; and a thrust force acting on the stator 104, by F3. Motion equations for the first mover 105, the second mover 106, and the stator 104 are given by the following three equations.

$$F1 = m1 \times a1 \quad (1)$$

$$F2 = m2 \times a1 \quad (2)$$

$$F3 = m2 \times a3 \quad (3)$$

The counterreaction absorption (counter) mechanism effectively functions when the motion equation for the first mover 105 and the motion equation for the stator 104 are equal. In other words, the counterreaction absorption mechanism effectively functions when the next equation holds.

$$F1 = F3 \quad (4)$$

Here, when the first mover 105 is moved, a thrust force acted on the stator 104 is represented by F', and let's represent the acceleration of the stator 104, by a'. The acceleration (a3) of the stator 104, which is a counterweight, is the sum of the acceleration (a') due to the thrust force (F') acted on the stator 104 (where a'<a1) when the first mover 105 is moved and the acceleration (a2) of the immovable second mover 106. In other words, the following equations hold.

$$a3 = a' + a2 \quad (5)$$

$$F3 = F' + F2 \quad (6)$$

In this case, an acceleration required of the second mover 106 is calculated using the above equations. To put it concretely, after equations (1), (3), and (5) are substituted into equation (4), the acceleration a2 is calculated.

$$m1 \times a1 = m2 \times a3 = m2(a' + a2) \quad (7)$$
$$\therefore a2 = (m1/m2) \times a1 - a'$$

By setting the acceleration of the second mover 106 to a2 that is calculated by substituting numerical values into equation (7), the counter mechanism effectively functions. However, as mentioned above, since the second mover 106 is fixed to the base 101, the stator 104 is moved instead of the second mover 106 in a direction opposite to the direction in which the first mover 105 is moved. With this, it becomes possible to try to utilize the vibration suppression of the table 100.

In the present embodiment, while the second mover 106 fixed to the base 101 is installed, the stator 104 is set to be freely movable. With this, since the stator 104 can be used as the counterweight, the counter mechanism can be downsized. Furthermore, since the acceleration of the stator 104 is controlled by the immovable second mover 106, it becomes possible to adjust proper vibration-suppressing moving distances for individual tables, so that counter mechanisms in consideration of the differences among the individual tables can be prepared.

Figure 29:
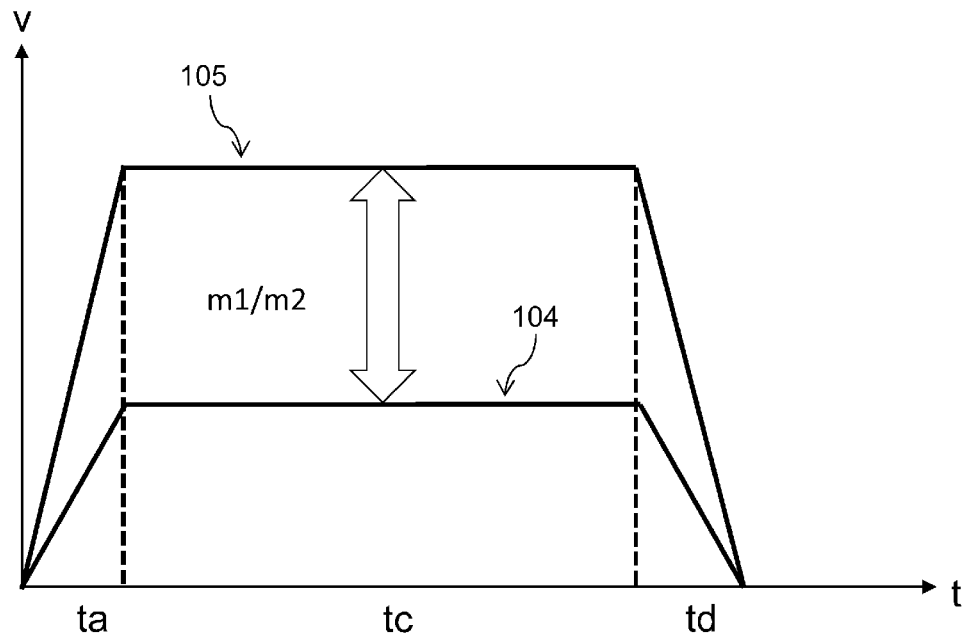
FIG. 29 is a diagram showing relationships between the speeds of a first mover and a stator and time.

The calculation of the acceleration of the stator 104 coordinated with the acceleration of the first mover 105 is made as described above. This calculation will be explained with reference to a v-t graph shown in FIG. 29. FIG. 29 is a diagram showing relationships between the speeds of a first mover and a stator and time. Assuming that the acceleration time period, constant speed time period, and deacceleration time period of the first mover 105 are respectively represented by ta, tc, and td, the counter can be established by coordinating the acceleration time period, constant speed time period, and deacceleration time period of the stator 104, which is moved by the second mover 106, with those of the first mover 105. In this case, it is necessary that the stator 104, which is operated by the second mover 106, should be moved with the same stroke as the stroke of the first mover 105. However, in the case where the stator 104 is used for the counter mechanism, since the acceleration of the stator 104 can be changed at a mass ratio of m1/m2 to the acceleration of the first mover 105, it also becomes possible to freely adjust the movement speed of the stator 104. Therefore, it also becomes possible to make the stroke range of the stator 104 narrower than that of the first mover 105.

Since a counter operation can be controlled freely in the table according to the present embodiment, even if another table is mounted on an apparatus on which the former table is mounted, it is possible to generate a vibration by moving the stator using the second mover in the former table so that a vibration in the latter table is cancelled when the latter table is in operation. With this, since the vibration in the latter table can be suppressed without installing a vibration suppression mechanism in the latter table, the apparatus is prevented from growing in size, which leads to the suppression of both enlargement of the space and cost of the apparatus.

Figure 7:
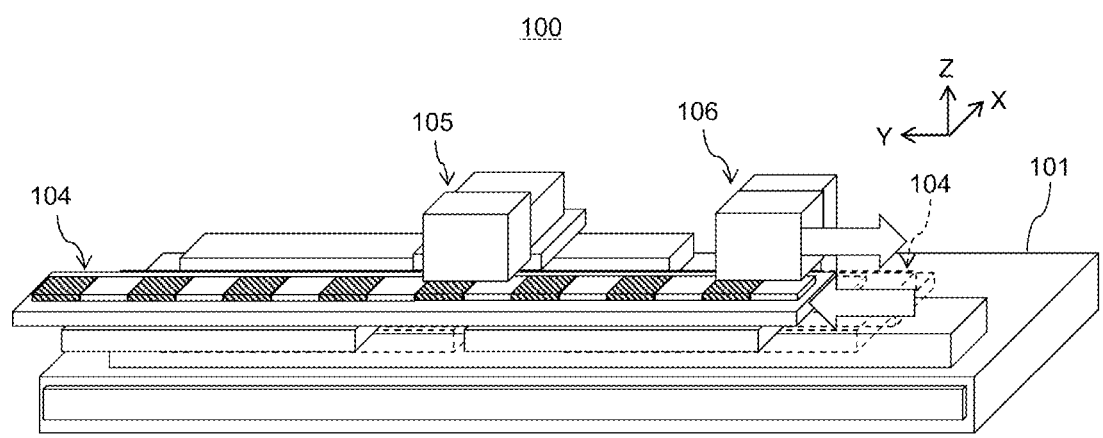
FIG. 7 is a perspective view of the table shown in FIG. 5 in the case where a stator is moved in a direction opposite to a direction shown in FIG. 6.
Figure 8:
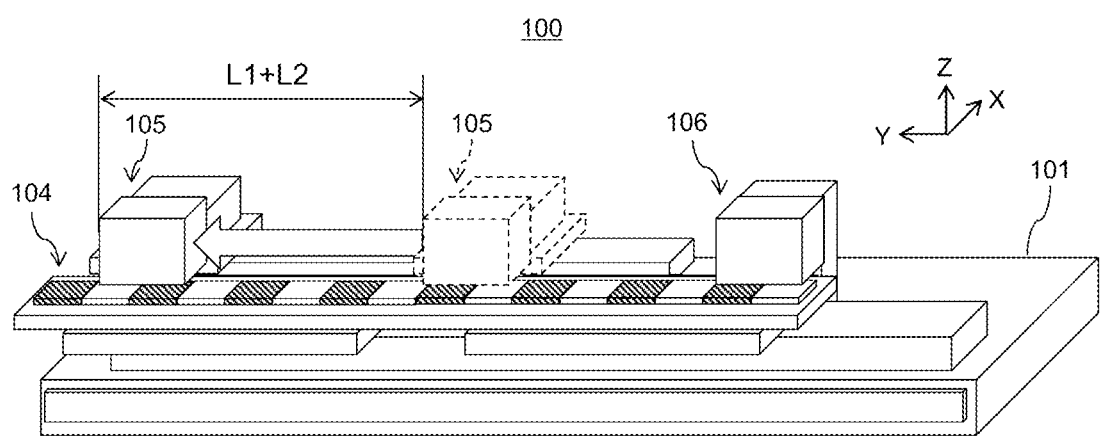
FIG. 8 is a perspective view of the table shown in FIG. 7 used for explaining the stroke of a first mover.

The stroke extension operation of the table according to the present embodiment will be explained with reference to FIG. 5 to FIG. 8. FIG. 7 is a perspective view of the table shown in FIG. 5 in the case where the stator is moved in a direction opposite to the direction shown in FIG. 6. FIG. 8 is a perspective view of the table shown in FIG. 7 used for explaining the stroke of a first mover.

As described above, in the case where the counterreaction absorption operation is performed in the table 100, the stator 104 is moved in a direction opposite to the direction in which the first mover 105 is moved through the control device 110 virtually moving the immovable second mover 106 in the same direction as the direction in which the first mover 105 moves, so that the counter operation is performed as shown in FIG. 6. Here, the stroke (movable range) of the first mover 105 is represented by L1. In addition, as shown in FIG. 5, the right end of the second mover 106 is fixed with a distance L2 from the right end of the stator 104 before the first mover 105 and the stator 104 are moved.

As shown in FIG. 7, when the control device 110 virtually moves the second mover 106 in a direction opposite to the direction in which the first mover 105 is moved (the Y axis direction), the stator 104 moves in the same direction as the direction in which the first mover 105 moves. Since the stator 104 can move up to L2, the stroke of the first mover 105 can be extended from L1 to L1+L2 as shown in FIG. 8. As mentioned above, in the case where the stroke of the first mover 105 is extended, the enlargement of the table can be limited to the minimum, so that the cost of the apparatus can be reduced owing to the compact design, the reduction of the man-hours for assembly of the apparatus, and the reduction of the number of parts.

For example, if the present table is installed in the bonding table of a die bonding apparatus, the quality and maintainability of the die bonding apparatus can be improved by preparing consumable articles that treat die bonding such as a unit for replacing/cleaning a collet within the range of the extended stroke other than a stroke within which the die bonding is executed. Furthermore, even if a long stroke drive is executed in an apparatus having two pairs of lanes used for transferring substrates in the extension direction of the bonding table (the Y axis direction) or the like, the long stroke drive can be executed inexpensively by downsizing a stator.

MODIFICATION EXAMPLES

Hereinafter, some typical modifications of the embodiment will be illustrated. In the following modifications, it will be assumed that components that have the same configurations and functions as those of components described in the above embodiment are given the same reference signs as those given to the components described in the above embodiment. And it will be assumed that, in descriptions about such components, the descriptions about the corresponding components of the above embodiment are quoted accordingly as long as there is no technical contradiction. In addition, a part of the above embodiment and the entireties or parts of the plural modifications can be adapted to one another accordingly and intricately as long as there is no technical contradiction.

First Modification Example

Figure 9:
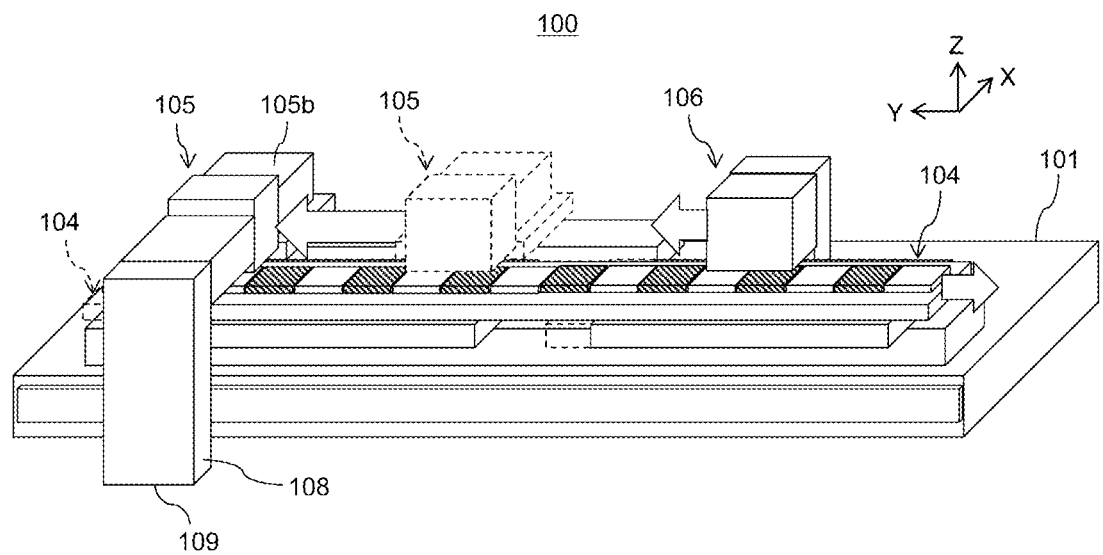
FIG. 9 is a perspective view of a table according to a first modification.
Figure 10:
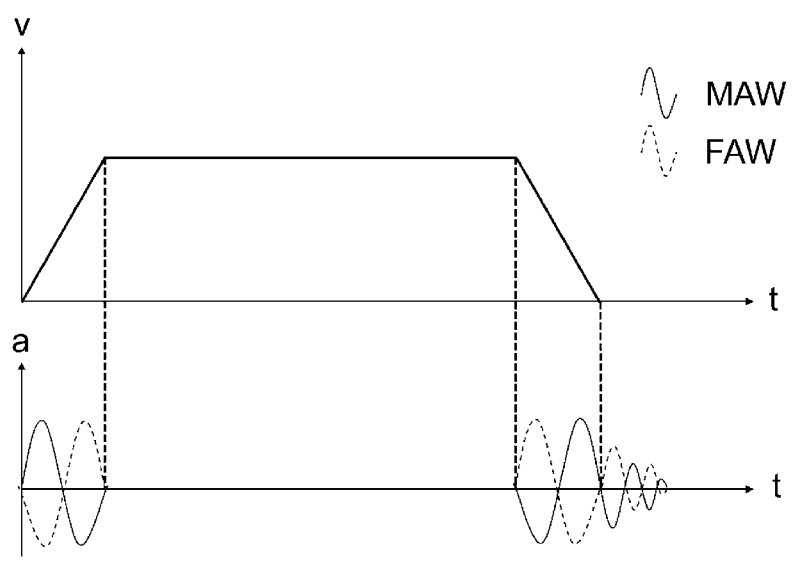
FIG. 10 is a diagram showing the waveforms of the speed and acceleration of a first mover and the waveform of the acceleration of a stator.

The table according to a first modification will be explained with reference to FIG. 9 and FIG. 10. FIG. 9 is a perspective view of a table according to the first modification. FIG. 10 is a diagram showing the waveforms of the speed and acceleration of a first mover and the waveform of the acceleration of a stator.

As shown in FIG. 9, a table 100 according to the first modification is equivalent to the table according to the embodiment further including an acceleration sensor 109 installed on the tip of the driven body 108 connected to the first mover 105 of the table according to the embodiment, and other components of the table according to the first modification is the same as those of the table according to the embodiment.

When a first mover 105 executes an acceleration/deacceleration movement as shown in FIG. 10, a stator 104 executes a movement with an acceleration time waveform (FAW) having a phase opposite to the phase of the acceleration time waveform (MAW) of the first mover 105, with the result that counter is established. As described before, the control device 110 according to the embodiment controls the first mover 105 and the second mover 106 independently of each other, and moves the second mover 106 in parallel with and in the same direction of the movement of the first mover 105 but asynchronously with the movement of the first mover 105, so that a counter operation is performed. In the counter operation of the first modification, as is the case with the embodiment, the waveform of a swingback that occurs in association with an acceleration is measured using the acceleration sensor 109, and the waveform of the swingback is reflected in a standard acceleration waveform with which the second mover 106 makes the stator 104 move.

To put it concretely, after a waveform having a phase opposite to the phase of the waveform measured by the acceleration sensor 109 is calculated by the measurement section and calculation section of the control device 110, the acceleration of the second mover 106 is calculated in real time, with the result that a counter operation is established.

The counter operation according to the embodiment is performed on an optimal operation estimated by measuring an acceleration and the like in the operation of bonding performed in advance and the like. For example, standard values obtained from measurement data stored in advance, or values estimated using the correlation between accelerations and vibrations calculated in advance are used. A thrust force is calculated from the acceleration of the first mover 105 and the weight of the first mover 105 obtained by calculation on the basis of the optimal operation obtained from the estimated result, so that the kinetic energy of the first mover 105 is calculated. An acceleration necessary for the stator 104 is calculated using the weight of the entirety of the stator 104 so that the kinetic energy of the stator 104 becomes equal to the kinetic energy of the first mover 105. By inputting the acceleration necessary for the stator 104 to the second mover 106 during the same time period as a time period during which the first mover 105 is accelerated, the counter operation is performed.

In the present modification, since the acceleration of the second mover 106 is measured in real time using the acceleration sensor 109, a control device 110, which executes the abovementioned calculation, executes the calculation every time the acceleration is measured, and corrects the acceleration inputted to the second mover 106 in real time, so that a counter can always and automatically be realized using an appropriate acceleration. Although the acceleration of the first mover 105 of the bonding head or the like according to the embodiment is automatically set using the predefined speed, the acceleration may change due to the aging of loads such as the linear motion guides, so that the counter mechanism according to the present modification is effective.

Second Modification Example

Figure 11:
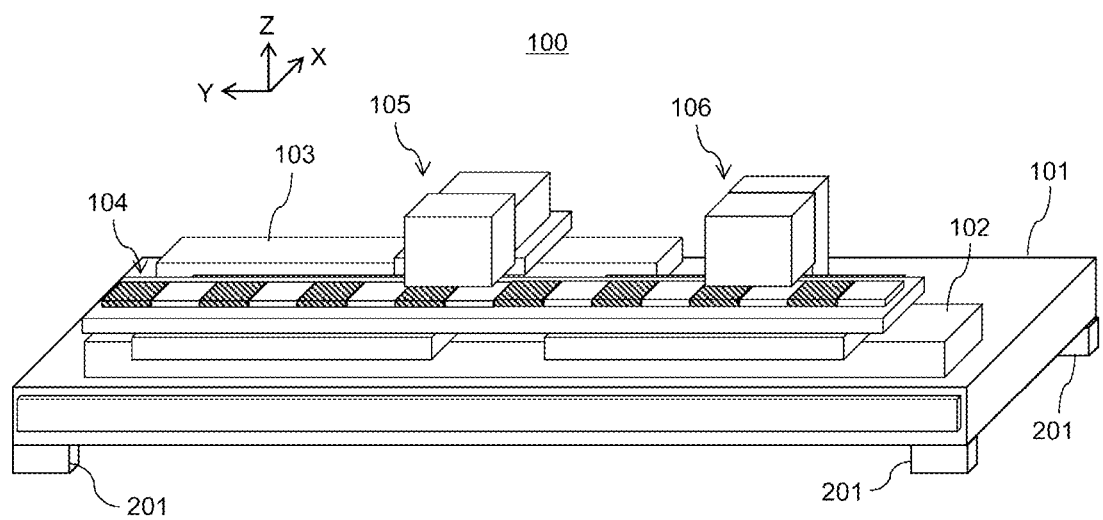
FIG. 11 is a perspective view of a table according to a second modification.

A table according to a second modification will be explained with reference to FIG. 11. FIG. 11 is a perspective view of the table according to the second modification.

The table 100 according to the second modification is equivalent to the table according to the embodiment further including weight sensors 201 installed on two or more positions under the base 101 on which both first linear motion guide 102 and second linear motion guide 103 are installed, and other components of the table according to the second modification is the same as those of the table according to the embodiment. If a counter operation is performed in consideration of only the suppression of vibration in the Y axis direction, two weight sensors have only to be installed on both ends (two positions) of the base 101 in the Y axis direction. If the X axis component of the center of gravity of the table is taken into consideration, it is necessary that four weight sensors should be installed on the four corners (four positions) of the base 101 as shown in FIG. 11.

In the second modification, the following controls are performed in the counter operation according to the embodiment. Before the first mover 105 is moved, the weights of the two weight sensors 201 are memorized for example, and when the first mover 105 is moved, the movement of the stator 104 is controlled by the second mover 106 so that a weight balance detected by these weight sensors 201 is kept intact. In other words, the stator 104 is given a thrust force by the second mover 106 in such a way that the position of the center of gravity of a combination of the first mover 105 and the stator 104 during the movement of the first mover 105 always becomes the same as that of the combination of the first mover 105 and the stator 104 before the first mover 105 starts moving, so that the stator 104 is controlled so as to move in a direction opposite to a direction in which the first mover 105 moves.

The following operations are manually performed in advance. In the following descriptions, a weight balance is a ratio of weights detected by, for example, the two weight sensors 201, and is not the absolute value of a difference between the two weights. In addition, an example in which the driven body 108 is a bonding head will be explained below.

(Simple Operation)
- (1-1) The first mover 105 for driving the bonding head is moved to a pickup position for picking up a die (start position), and a weight balance in the case of the bonding head being in the start position is measured. Here, the stator 104 remains in the start position.
- (1-2) The first mover 105 is moved to a position for bonding the die (stop position), and the weight balance at that time is measured. Here, the stator 104 is not moved, and remains in the start position.
- (1-3) In a state where the first mover 105 is kept in the bonding position, the stator 104 is moved until the weight balance becomes the value of the weight balance at the time when the first mover 105 is in the pickup position (start position), and a position to which the stator is moved is memorized.
- (1-4) The stator 104 is moved from the start position to the position memorized at step (1-3) during the same time period as the time period during which the first mover 105 is moved from the pickup position (start position) to the bonding position (stop position) in the Y axis direction.

(Detail Operation)

The operation explained in the first modification is performed while the bonding head is being accelerated, and while the bonding head is moved at a low speed, the above operation is performed in consideration of the weight balance as well as the movement amount of the bonding head while the bonding head is being accelerated.

Here, the weight sensors 201 can be installed under both ends of the first linear motion guide 102 and under both ends of the second linear motion guide 103 and on the base 101 respectively.

Third Modification Example

Figure 12:
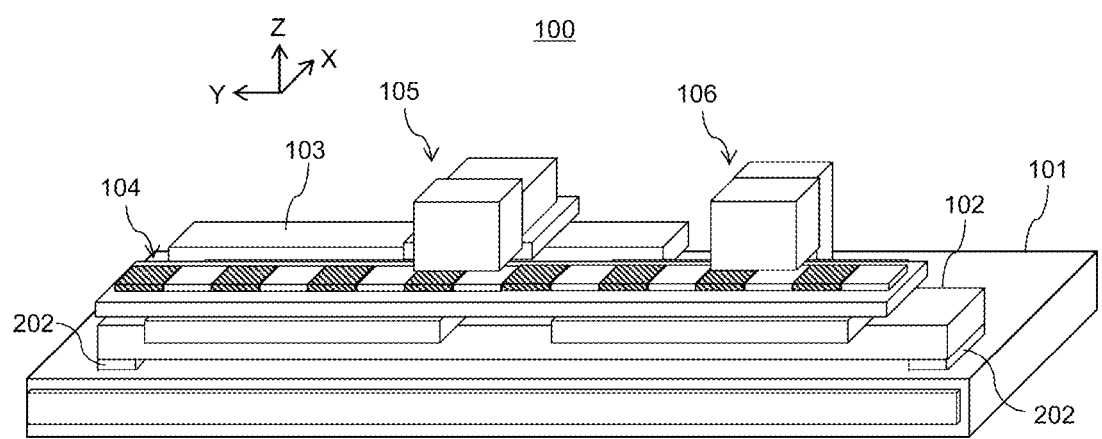
FIG. 12 is a perspective view of a table according to a third modification.

A table according to a third modification will be explained with reference to FIG. 12. FIG. 12 is a perspective view of the table according to the third modification.

The table 100 according to the third modification is equivalent to the table according to the embodiment further including vibration suppression members 202 such as vibration suppression dampers, balancers (pendulum counter) for absorbing a vibration in the Z axis direction or the like installed under both ends of the first linear motion guide 102 and under both ends of the second linear motion guide 103 and on the base 101 respectively, and other components of the table according to the third modification are the same as those of the table according to the embodiment. Here, it is conceivable that the vibration suppression members 202 are installed under the four corners of the base 101 and on the pedestal of a die bonding apparatus according to the third modification apparatus respectively.

Fourth Modification Example

Figure 14:
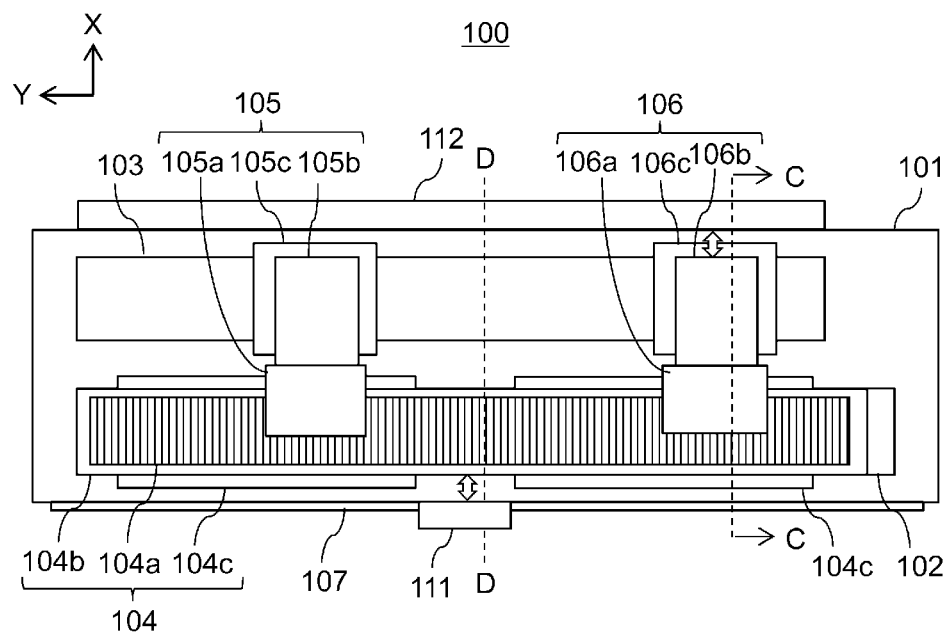
FIG. 14 is a top view of a table according to a fourth modification.
Figure 15:
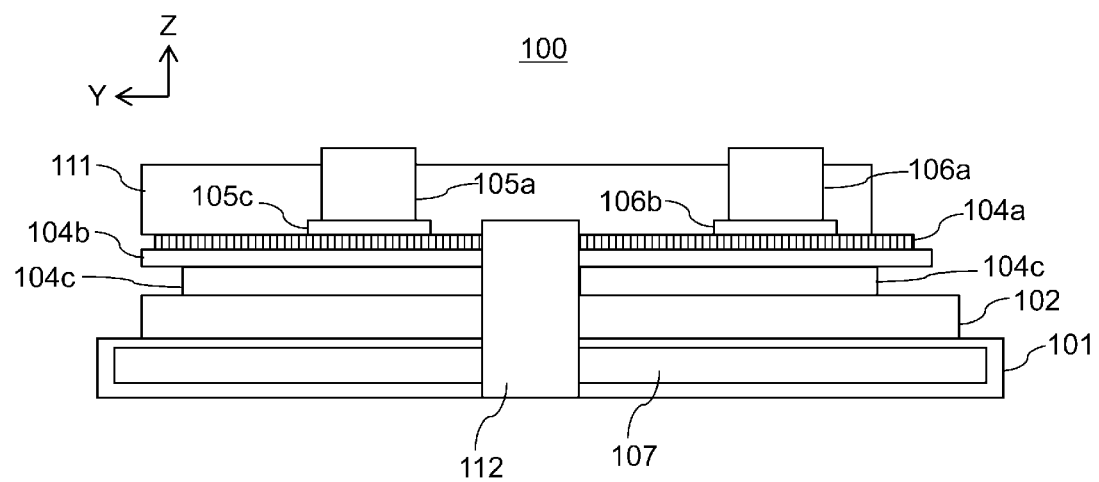
FIG. 15 is a front view of the table according to the fourth modification.
Figure 16:
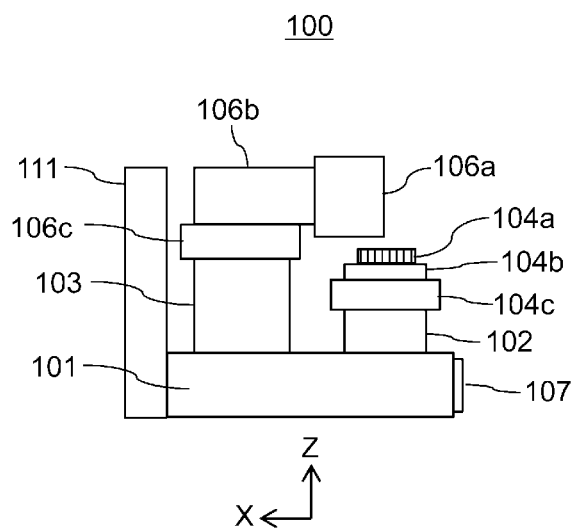
FIG. 16 is a cross-sectional view taken along a line C-C shown in FIG. 14.
Figure 17:
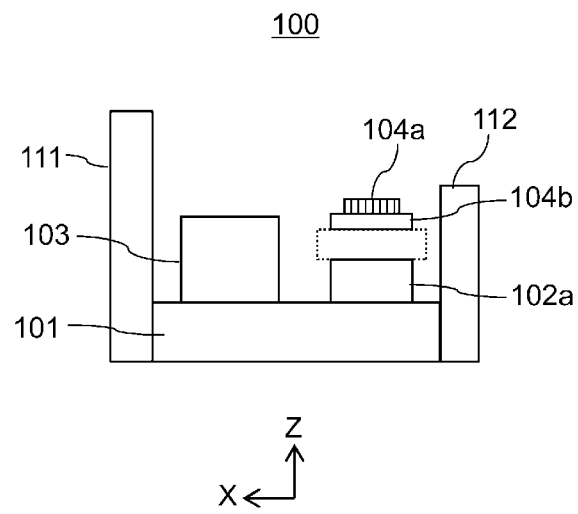
FIG. 17 is a cross-sectional view taken along a line D-D shown in FIG. 14.

A table according to a fourth modification will be explained with reference to FIG. 14 to FIG. 17. FIG. 14 is a top view of the table according to the fourth modification. FIG. 15 is a front view of the table according to the fourth modification. FIG. 16 is a cross-sectional view taken along the line C-C shown in FIG. 14. FIG. 17 is a cross-sectional view taken along the line D-D shown in FIG. 14.

The table 100 according to the fourth modification is equivalent to the table according to the embodiment further including an electromagnetic clutch 111 that makes the stator 104 fixed or movable and a clamping plate 112 that makes the second mover 106 fixable. Furthermore, the second mover 106 is installed on the second linear motion guide 103 as is the case with the first mover 105. Therefore, the second linear motion guide 103 is configured to extend longer in the Y axis direction in the fourth modification than in the embodiment. The second mover 106 according to the fourth modification incudes a support member 106b that supports a coil section 106a, and a second linear motion slider 106c that moves on the second linear motion guide 103. The support member 106b is installed on the second linear motion slider 105c as is the case with the support member 105b. Other components of the table 100 according to the fourth modification is the same as those of the table according to the embodiment.

The electromagnetic clutch 111 includes a coil, and an electromagnetic force generated by energizing the coil attracts a yoke 104b that is made of a ferromagnetic material and included in the stator 104, so that the stator 104 is fixed. The electromagnetic force is extinguished by stopping the energization of the coil, so that the electromagnetic clutch 111 loses the force to attract the yoke 104b and the stator 104 is made movable. The stator 104 can be fixed in an arbitrary position using the electromagnetic clutch 111.

The clamping plate 112 is made of a ferromagnetic material, and disposed in such a way as to extend along the second linear motion guide 103. The support member 106b includes a coil as is the case with the electromagnetic clutch 111, and an electromagnetic force generated by energizing the coil attracts the clamping plate 112, so that the second mover 106 is fixed. The electromagnetic force is extinguished by stopping the energization of the coil, so that the support member 106b loses the force to attract the clamping plate 112 and the second mover 106 is made movable. The second mover 106 can be fixed in an arbitrary position using the electromagnetic clutch function of the support member 106b and the clamping plate 112.

Figure 18:
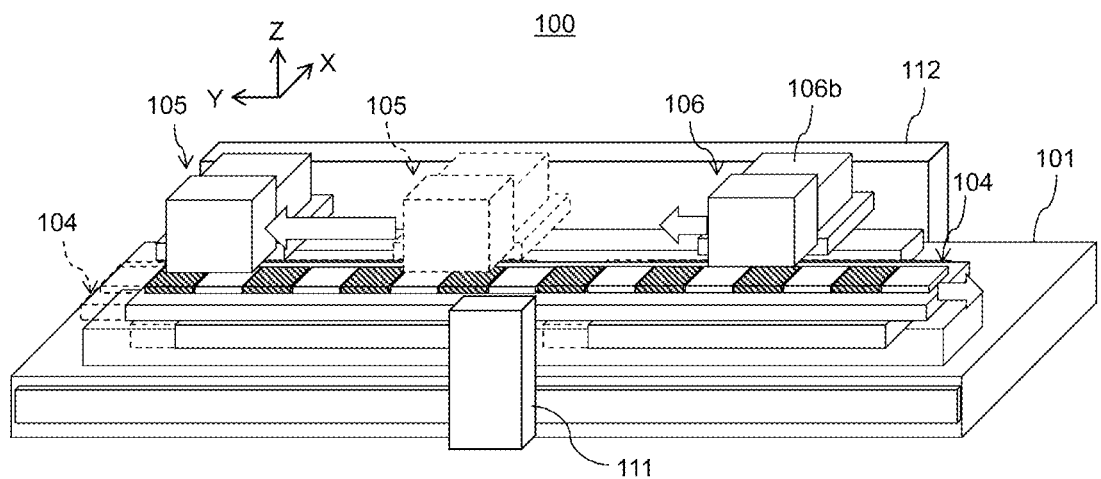
FIG. 18 is a perspective view of the table according to the fourth modification used for explaining a first counterreaction absorption operation of the table.
Figure 19:
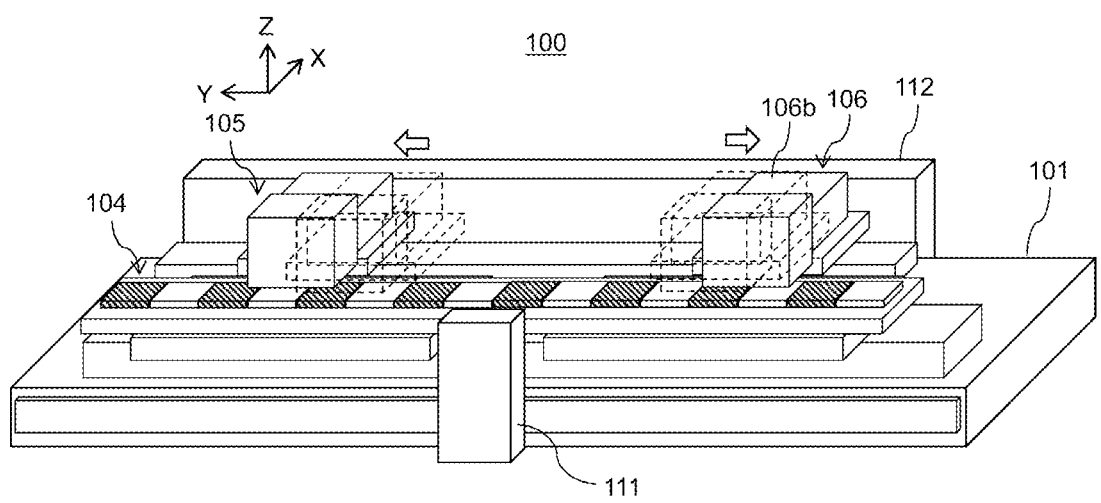
FIG. 19 is a perspective view of the table according to the fourth modification used for explaining a second counterreaction absorption operation of the table.

The counterreaction absorption operation of the table according to the fourth modification will be explained with reference to FIG. 18 and FIG. 19. FIG. 18 is a perspective view of the table according to the fourth modification used for explaining a first counterreaction absorption operation of the table. FIG. 19 is a perspective view of the table according to the fourth modification used for explaining a second counterreaction absorption operation of the table.

In the case where the first mover 105 executes a large movement, as shown in FIG. 18, the second mover 106 is fixed to the clamping plate 112 by the electromagnetic clutch function of the support member 106b, and at the same time, the stator 104 is made movable by the electromagnetic clutch 111, so that a counter operation is performed using the stator 104 as is the case with the embodiment.

In the case where the first mover 105 executes a small movement, as shown in FIG. 19, the second mover 106 is made movable by the electromagnetic clutch function of the support member 106b, and at the same time, the stator 104 is fixed by the electromagnetic clutch 111, so that the counter operation is performed using the second mover 106.

Figure 20:
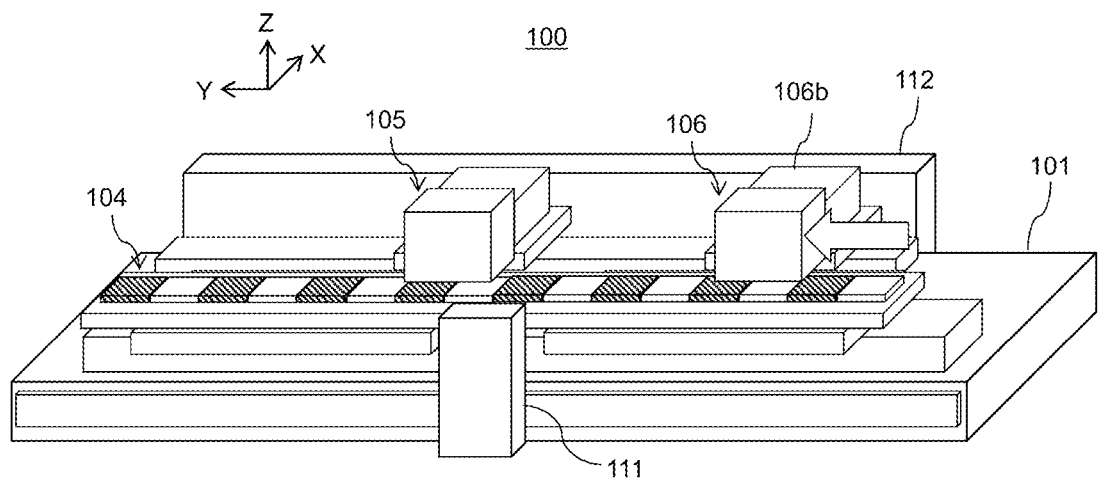
FIG. 20 is a perspective view of the table according to the fourth modification in a state where a second mover of the table is moved to a predefined position.
Figure 21:
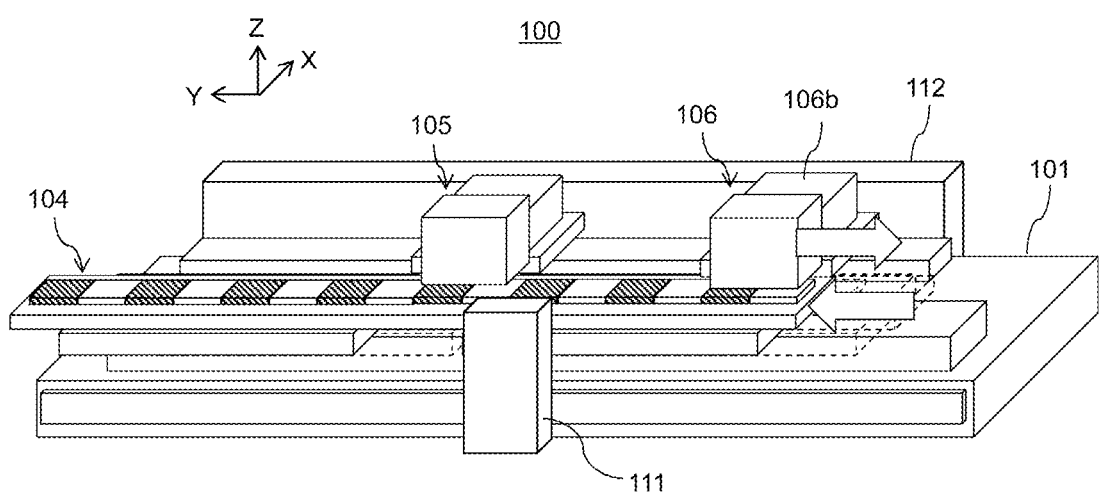
FIG. 21 is a perspective view of the table according to the fourth modification in a state where a stator of the table is moved in its traveling direction.
Figure 22:
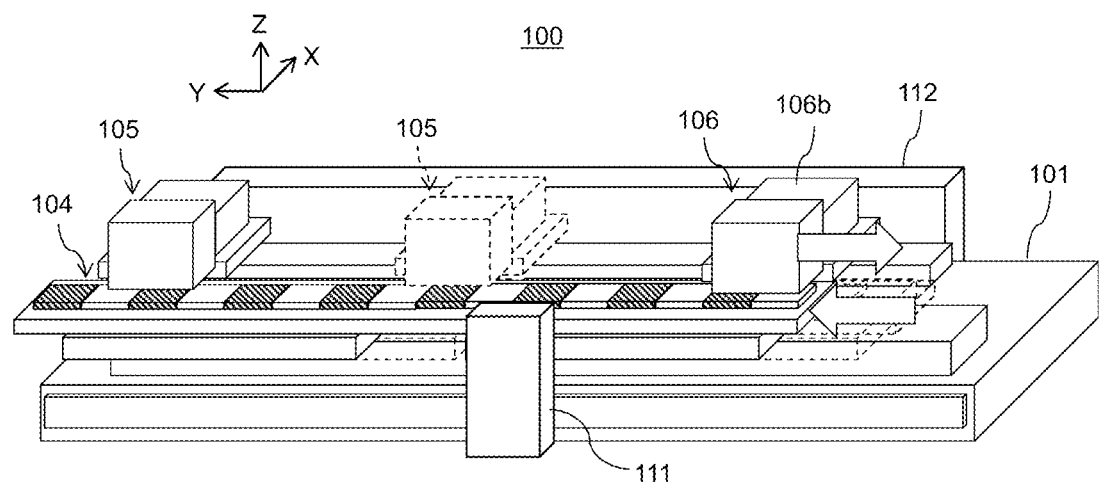
FIG. 22 is a perspective view of the table according to the fourth modification in a state where a first mover of the table is moved in its traveling direction.

The stroke extension operation of the table according to the fourth modification will be explained with reference to FIG. 20 to FIG. 22. FIG. 20 is a perspective view of the table according to the fourth modification in a state where the second mover of the table is moved to a predefined position. FIG. 21 is a perspective view of the table according to the fourth modification in a state where the stator of the table is moved in its traveling direction. FIG. 22 is a perspective view of the table according to the fourth modification in a state where the first mover of the table is moved in its traveling direction.

The stator 104 is fixed by the electromagnetic clutch 111, and at the same time, the second mover 106 is made movable by the electromagnetic clutch function of the support member 106b. As shown in FIG. 20, after the second mover 106 is moved a predefined distance in a traveling direction in which the first mover 105 is moved, the second mover 106 is fixed by the electromagnetic clutch function of the support member 106b. As shown in FIG. 21, if the second mover 106 is virtually moved in a direction opposite to the direction in which the first mover 105 is moved, the stator 104 is moved in the same direction as the direction in which the first mover 105 is moved. With this, as shown in FIG. 22, the stroke of the first mover 105 can be extended as is the case with the embodiment.

Fifth Modification Example

Figure 13A:
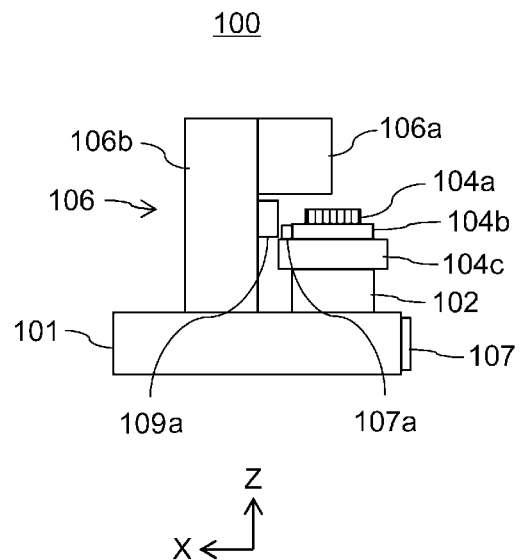
FIG. 13A is a diagram corresponding to a cross-sectional view of a table according to a fifth modification taken along a line corresponding to the line B-B shown in FIG. 1.
Figure 13B:
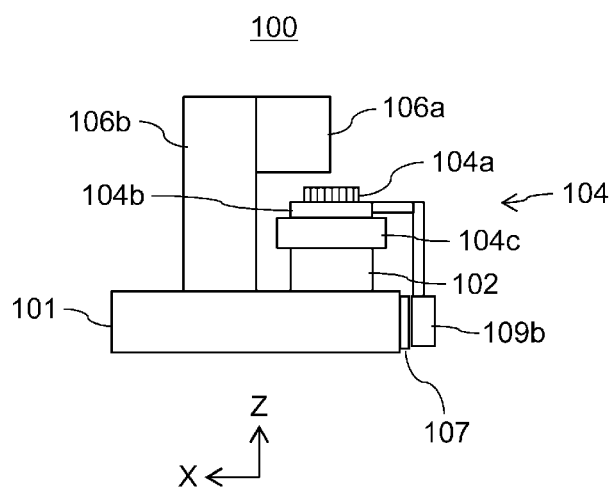
FIG. 13B is a diagram corresponding to a cross-sectional view of a table according to another example described in the fifth modification taken along the line B-B shown in FIG. 1.

The configuration of a table according to a fifth modification will be explained with reference to FIG. 13A and FIG. 13B. FIG. 13A is a diagram corresponding to a cross-sectional view of the table according to the fifth modification taken along the line B-B shown in FIG. 1. FIG. 13B is a diagram corresponding to a cross-sectional view of a table according to another example described in the fifth modification taken along the line B-B shown in FIG. 1.

The table 100 according to the fifth modification is equivalent to the table according to the embodiment further including a linear sensor for detecting the position of the stator 104.

As shown in FIG. 13A, a linear sensor is composed of a scale 107a installed on the side surface of the stator 104 facing the second mover 106 and an optical detection sensor 109a installed on the support member 106b of the second mover 106. With this, transfer control for transferring the stator 104 to a target position such as position control or speed control is also performed on the basis of the output of the linear sensor. It becomes possible that the second mover 106 is controlled using, for example, the control method described in Japanese Unexamined Patent Application Publication No. 2015-173551.

Here, as shown in FIG. 13B, it is conceivable that the linear sensor is composed of an optical detection sensor 109b installed on the stator 104 and a scale 107 installed on the base 101.

Sixth Modification Example

Figure 28:
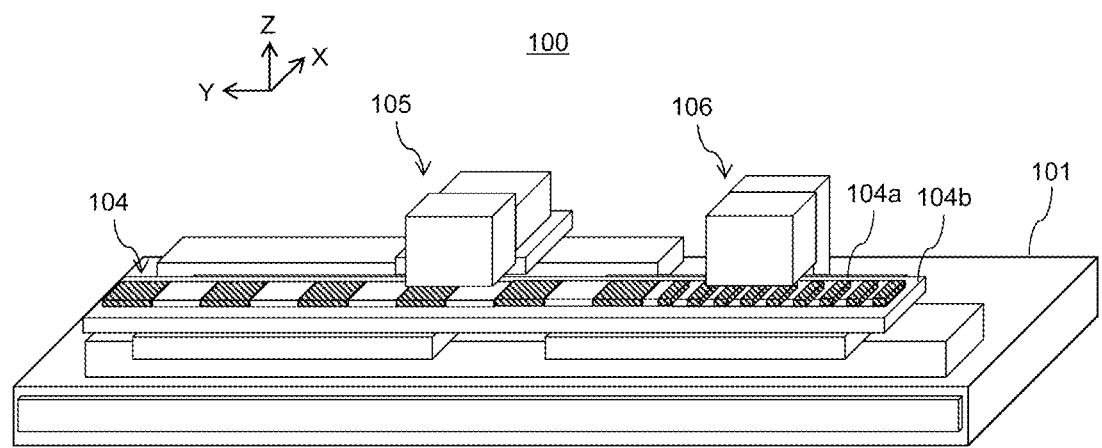
FIG. 28 is a perspective view of a table according to a sixth modification.

The configuration of a table according to a sixth modification will be explained with reference to FIG. 28. FIG. 28 is a perspective view of the table according to the sixth modification.

Although it is explained that, in the embodiment, the N poles and S poles of the permanent magnets of the magnet section 104a of the stator 104 are uniformly and alternately disposed, it is conceivable that the N poles and S poles of permanent magnets on a part of the magnet section 104a of the stator 104 that operate while facing the second mover 106 are more densely disposed or the sizes of the permanent magnets are changed in order to increase a thrust force. In other words, in the sixth modification, the N poles and S poles of the permanent magnets of the magnet section 104a disposed on the yoke 104b are arranged in the same way but some permanent magnets are accordingly downsized and densely disposed, which makes it possible for the coil section 106a of the second mover 106 to perform detail operations. Generally speaking, the weight of the stator including plural magnet plates becomes heavy, so that the movement amount of the stator is apt to be small. The smaller gaps between S poles and N poles are, the more accurately the coil section 106a of the second mover 106 can be moved with a small stroke. With this, even in the case where the weight of the second mover 106 is largely different from that of the stator 104, or the movement amount of the second mover 106 and that of the stator 104 are different from each other owing to the above weight difference (these movement amounts become very small), it is possible to make the second mover 106 and the stator 104 move in synchronization with each other and with the same accuracy. For example, in the case where the weight ratio is 5/1, if the S poles and N poles of some permanent magnets are disposed alternately and at a density five times higher, it becomes easy to perform synchronous control.

Seven Modification Example

Figure 30:
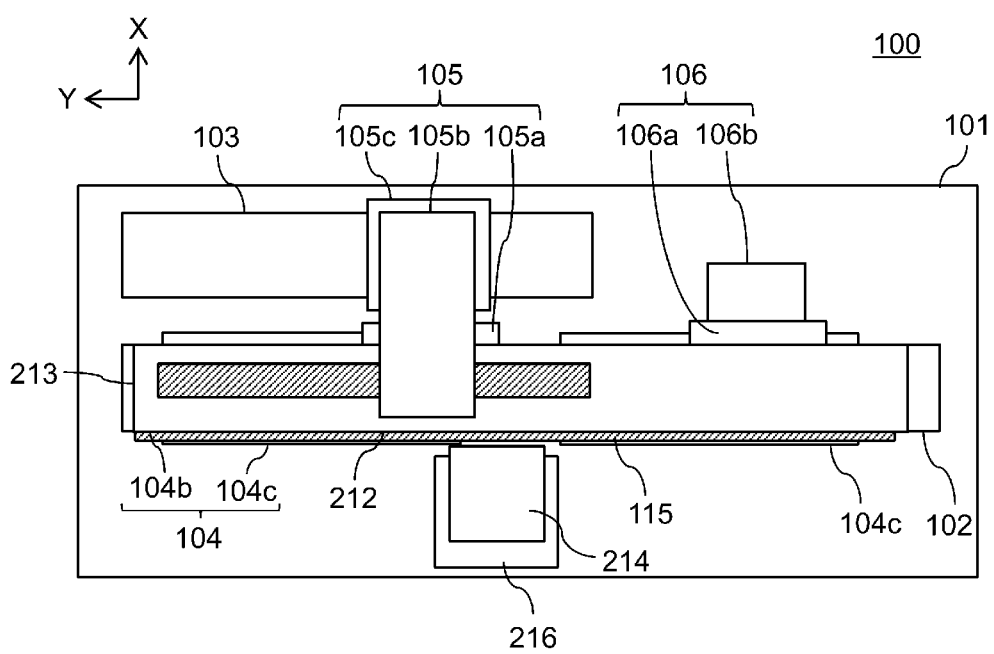
FIG. 30 is a top view of a table according to a seventh modification.
Figure 31:
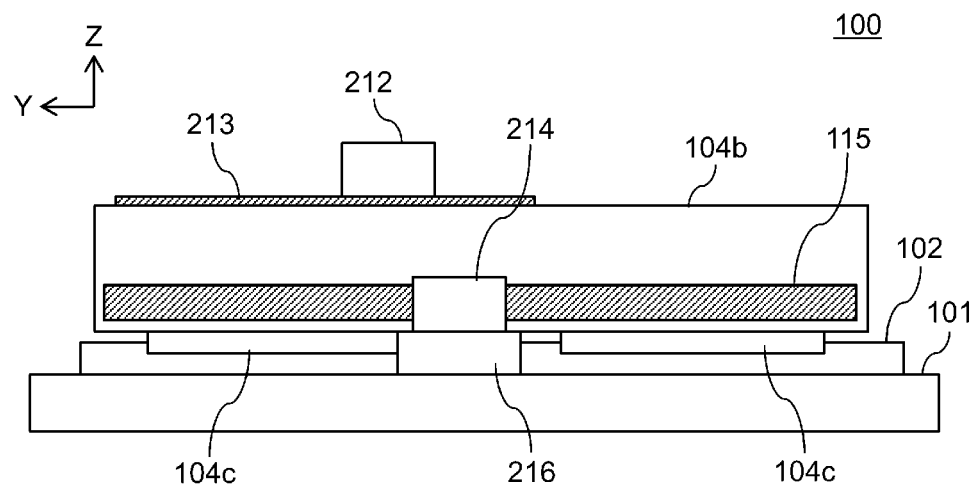
FIG. 31 is a front view of the table shown in FIG. 30.
Figure 32:
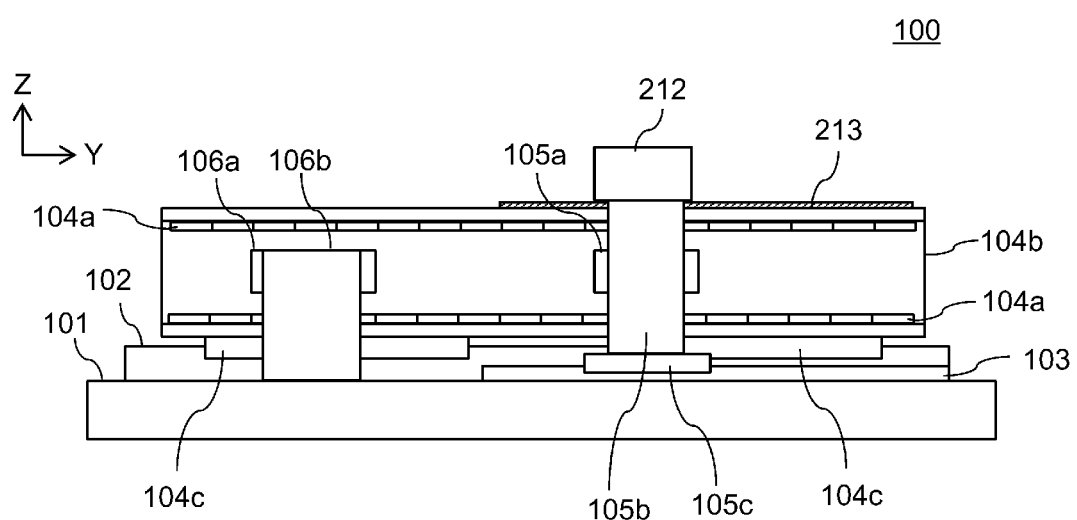
FIG. 32 is a rear view of the table shown in FIG. 30.
Figure 33:
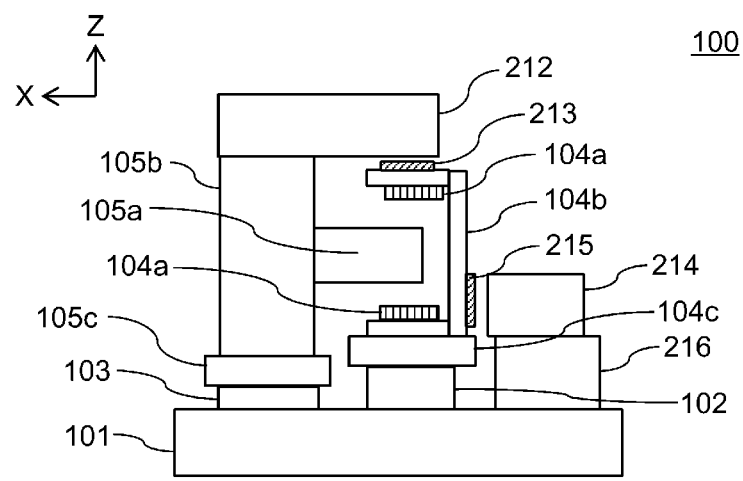
FIG. 33 is a left side view of the table shown in FIG. 30.

The configuration of a table according to a seventh modification will be explained with reference to FIG. 30 to FIG. 33. FIG. 30 is a top view of the table according to the seventh modification. FIG. 31 is a front view of the table shown in FIG. 30. FIG. 32 is a rear view of the table shown in FIG. 30. FIG. 33 is a left side view of the table shown in FIG. 30.

Although the scale 107 of the linear sensor for detecting the position of the first mover 105 is installed on the base 101 in the embodiment, a scale 213 for detecting the position of a first mover 105 is installed on a stator 104 in the seventh modification. In addition, a scale 215 for detecting the position of the stator 104 is also installed on the stator 104 in the seventh modification. Furthermore, since the scales 213 and 215 are installed on the stator 104, the configuration of the stator 104 are different from that of the embodiment. A table 100 according to the seventh modification is configured in the same way as the table according to the embodiment except for components concerning linear sensors of the table 100 according to the seventh modification. In the following, differences between the table 100 according to the embodiment and the table 100 according to the seventh modification will mainly be described.

First, the stator 104 according to the seventh modification will be explained. As shown in FIG. 33, the yoke 104b is U-shaped when seen from a side. One part of a magnet section 104a is installed on the lower surface of the horizontal portion of the upper part of the yoke 104b, the other part of the magnet section 104a is installed on the upper surface of the horizontal portion of the lower part of the yoke 104b, and a first linear motion slider 104c is installed on the lower surface of the horizontal portion of the lower part of the yoke 104b.

Next, the first mover 105 according to the seventh modification will be explained. A support member 105b is installed on a second linear motion slider 105c and extends over the upper surface of the horizontal portion of the upper part of the yoke 104b. A coil section 105a is supported by the support member 105b so that the coil section 105a is positioned halfway between the horizontal portion of the upper part and the horizontal portion of the lower part of the yoke 104b in terms of the vertical direction.

Next, a second mover 106 according to the seventh modification will be explained. The second mover 106 has the same configuration as the second mover 106 according to the embodiment, and a coil section 106a is supported by the upper part of a support member 106b so that the coil section 106a is positioned halfway between the horizontal portion of the upper part and the horizontal portion of the lower part of the yoke 104b in terms of the vertical direction.

Next, the linear sensors according to the seventh modification will be explained. A scanning head 212 used for the first mover 105 is connected to the upper surface of the support member 105b of the first mover 105. A driven body, which is similar to the driven body 108 shown in the embodiment, is connected to the scanning head 212. A scanning head 214 used for the stator 104 is supported by the upper surface of a support member 216 fixed to a base 101.

In addition, the table 100 includes the scale 213 that is used for the first mover 105 and installed on the upper surface of the horizontal portion of the upper part of the yoke 104b extending in the Y axis direction; and the scale 215 that is used for the stator 104 and installed on the side surface of the vertical portion of the yoke 104b so as to cover almost the entire range of the vertical portion of the yoke 104b. The scale 213 and an optical detection sensor (not shown) that is installed on the scanning head 212 compose a first linear sensor. The scale 215 and an optical detection sensor (not shown) installed on the scanning head 214 compose a second linear sensor.

The first linear sensor detects the position of the first mover 105 relative to the stator 104 in the Y axis direction, and the second linear sensor detects the position of the stator 104 relative to the base 101 in the Y axis direction. Transfer control for transferring the first mover 105 to a target position such as position control or speed control is performed on the basis of the output of the first linear sensor, and transfer control for transferring the stator 104 to a target position such as position control or speed control is performed on the basis of the output of the second linear sensor.

Generally speaking, a Hall sensor is used in a motor. The Hall sensor is a sensor that utilizes a galvanomagnetic effect called the Hall effect. The Hall sensor is generally used for rotation detection, position detection, opening and closing detection, current detection, direction detection, and the like. The Hall sensor is used in a linear motor for position detection in which the intensities and directions of magnetic fields are converted into voltages.

In order to perform the counter mechanism using a linear motor, it is necessary that, when the magnet section 104a of the stator 104 moves, a direction in which the coil section 105a of the first mover 105 moves should be correctly detected and the coil section 105a of the first mover 105 should be enabled to move a specified distance. If the phase of the movement of the first mover 105 and the phase of the movement of the stator 104 are different from each other, there is a probability that the shortage of a torque or an adverse movement occurs.

In the case where the position (absolute position) of the first mover 105 relative to the base 101 is measured using the linear sensor, since the stator 104 moves in a counter operation, the position of the first mover 105 relative to the stator 104 cannot be grasped. Therefore, it is necessary that, after the position of the first mover 105 relative to the stator 104 is detected using the Hall sensor installed on the coil section 105a of the first mover 105, the first mover 105 and the stator 104 should be controlled so that the phases of the movements of the first mover 105 and the stator 104 do not become different from each other (become equal to each other).

In the seventh modification, the position of the first mover 105 relative to the stator 104 can be grasped by fixing the scale 215 used for the first mover 105 so that the scale 215 faces the stator 104. With this, the position of the scale 215 in the movement of the stator 104 can be made to follow the arrangement of the magnetic poles of the magnet section 104a. Therefore, since the position of the first mover 105 relative to the stator 104 can be grasped without the control being performed, and a current with a correct phase (θ) can be passed through the coil of the first mover 105, a correct thrust force can be generated by the linear motor. In this case, in order to move the first mover 105 to a target position, it is necessary to take the movement amount of the stator 104 in the counter operation control into consideration. The movement amount of the stator 104 in the counter operation control can be calculated using the time-speed change characteristic of the stator 104 based on the ratio of the weight of the first mover 105 to the weight of the stator 104.

Eighth Modification Example

Figure 34:
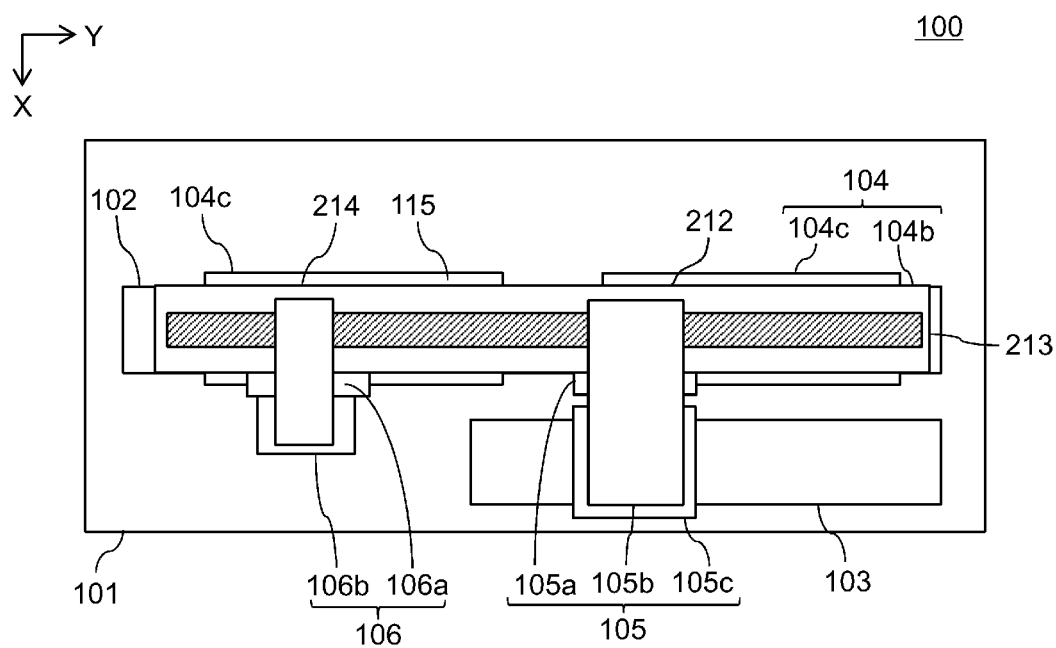
FIG. 34 is a top view of a table according to an eighth modification.
Figure 35:
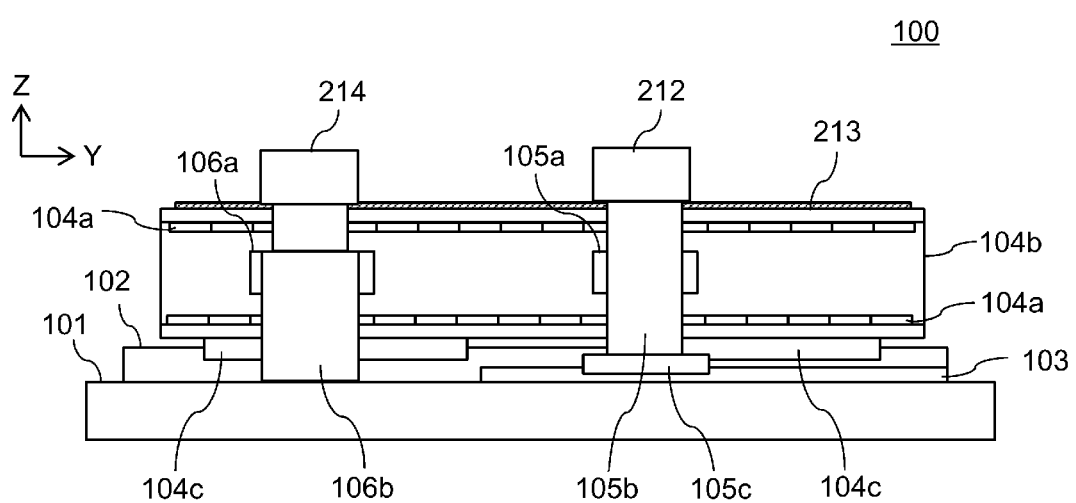
FIG. 35 is a rear view of the table shown in FIG. 34.

The configuration of a table according to an eighth modification will be explained with reference to FIG. 34 to FIG. 35. FIG. 34 is a top view of the table according to the eighth modification. FIG. 35 is a rear view of the table shown in FIG. 34.

In the seventh modification, there are two scales for the first mover 105 and for the stator 104, that is, the scale 213 is used for the first mover 105 and the scale 215 is used for the stator 104. In the eighth modification, one scale 213 that covers the entire range of the stator 104 is installed, and a first linear sensor of a first mover 105 and a second linear sensor installed on a second mover 106 fixed on a base 101 detect different positions of the scale 213 respectively.

Examples in which a table according to the embodiment or the modifications is applied for a die bonder, which is an example of a die bonding apparatus, will be explained below.

FIRST EXAMPLE

Figure 23:
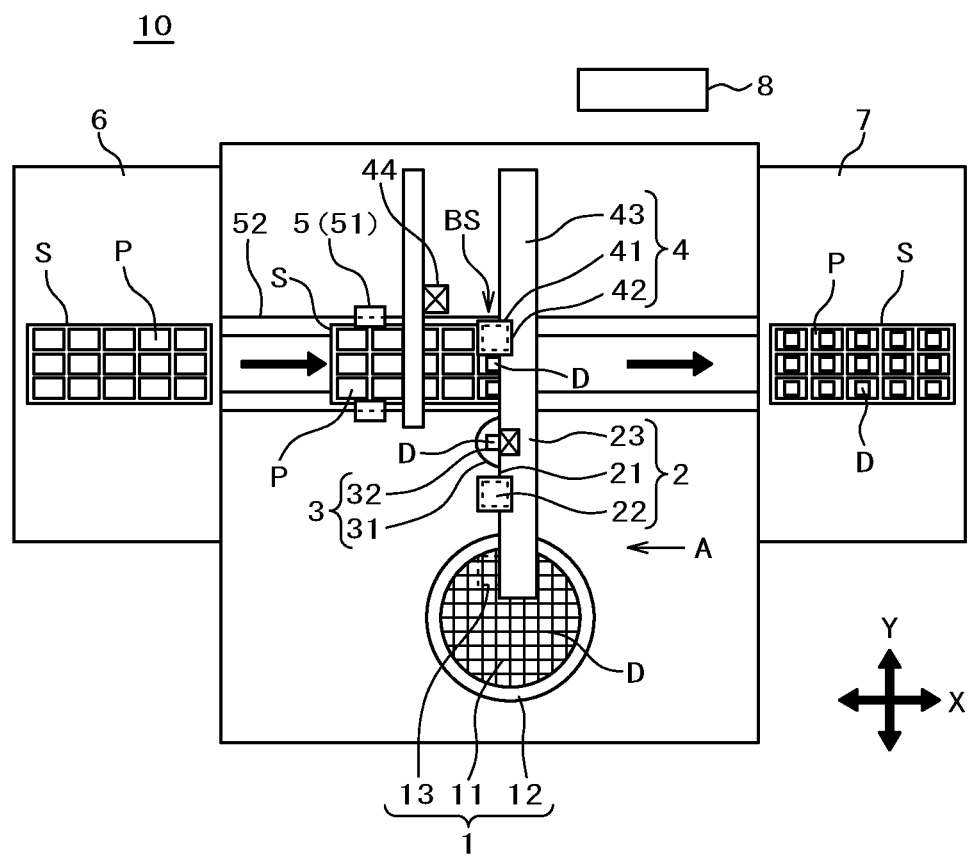
FIG. 23 is a top view showing the outline of a die bonder according to a first example.
Figure 24:
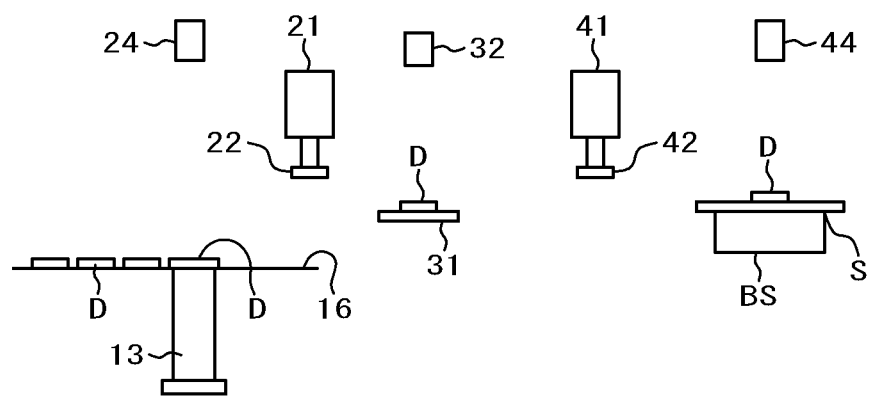
FIG. 24 is a diagram used for explaining the operations of a pickup head and a bonding head as viewed from a direction shown by an arrow A in FIG. 23.

FIG. 23 is a top view showing the outline of a die bonder according to a first example. FIG. 24 is a diagram used for explaining the operations of a pickup head and a bonding head as viewed from a direction shown by an arrow A.

Schematically describing, a die bonder 10 includes: a die feed section 1 that feeds a die D to be mounted on a substrate S; a pickup section 2; an intermediate stage section 3; a bonding section 4; a transfer section 5; a substrate feed section 6; a substrate carrying-out section 7; and a control device 8 that monitors and controls the operations of the respective sections. The Y axis direction is a direction along which the die bonder 10 moves back and forth, and the X axis direction is a direction along which the die bonder 10 moves left and right. The die feed section 1 is disposed on the front portion of the die bonder 10 and the bonding section 4 is disposed on the rear portion. Here, one or plural product areas (hereinafter, referred to as packages P) each of which finally becomes one package are printed on the substrate S.

First, the die feed section 1 feeds a die D to be mounted on a package area P of the substrate S. The die feed section 1 includes: a wafer hold stage 12 for holding a wafer 11; and a peeling-off unit 13 that peels off a die D from the wafer 11 and is shown in dashed lines. The die feed section 1 is moved in the X axis direction or Y axis direction by an unshown drive means, and moves a die D to be picked up to the position of the peeling-off unit 13.

The pickup section 2 includes: a pickup head 21 for picking up a die D; a Y axis drive section 23 for moving the pickup head 21 in the Y axis direction; unshown drive sections for moving a collet 22 up and down, rotating the collet 22, and moving the collet 22 in the X axis direction respectively. The pickup head 21 includes the collet 22 (also see FIG. 24) for sucking and holding the peeled-off die D at its tip, and picks up the die D from the die feed section 1 to mount the die D on an intermediate stage 31. The pickup head 21 includes unshown drive sections for moving the collet 22 up and down, rotating the collet 22, and moving the collet 22 in the X axis direction respectively.

The intermediate stage section 3 includes: the intermediate stage 31 on which a die D is temporally mounted; and a stage recognition camera 32 for recognizing a die D on the intermediate stage 31.

The bonding section 4 picks up a die D from the intermediate stage 31, and bonds the die D to a package area P of a transferred substrate S or bonds the die D to a die already-bonded on the package area P of the substrate S in such a manner that these dice are laminated. The bonding section 4 includes: a bonding head 41 having a collet 42 (also see FIG. 24) for sucking and holding a die D at its tip as is the case with the pickup head 21; a Y axis drive section 43 for moving the bonding head 41 in the Y axis direction; and a substrate recognition camera 44 for photographing the position recognition mark (not shown) of a package area P of a substrate S to recognize a bonding position in the package area P. The Y axis drive section 43 is composed of one or a combination of some of the tables according to the embodiment and the first modification to the fourth modification. The bonding head 41 is the driven body 108 according to the embodiment. With such a configuration, the bonding head 41 corrects the pickup position/posture of a die D on the basis of the photographed data of the stage recognition camera 32, picks up the die D from the intermediate stage 31, and bonds the die D to a substrate on the basis of the photographed data of the substrate recognition camera 44.

The transfer section 5 includes: a pair of substrate transfer claws 51 used for clawing and transferring a substrate S; and a pair of transfer lanes 52 along which the substrate S is moved. The substrate S is moved by driving the unshown nuts of the pair of substrate transfer claws 51 fixed to the pair of transfer lanes 52 by unshown ball screws fixed along the pair of transfer lanes 52. With the use of such a configuration, the substrate S is moved from the substrate feed section 6 to the bonding position along the pair of transfer lanes 52, and after the die D is bonded, the substrate S is moved to the substrate carrying-out section 7, and is passed to the substrate carrying-out section 7.

The control device 8 is corresponding to the control device 110 according to the embodiment and includes: memories for storing programs (software) for monitoring and controlling the operations of the respective sections of the die bonder 10; and a central processing unit (CPU) for executing the programs stored in the memories.

Figure 25:
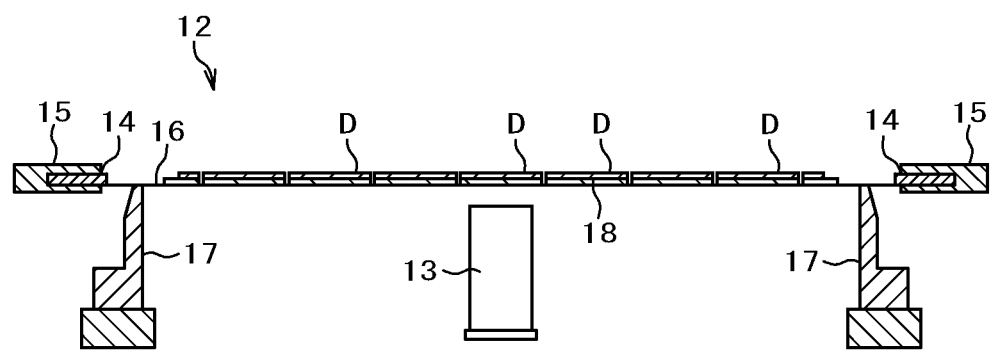
FIG. 25 is a schematic cross-sectional view showing the main portion of a die feed section shown in FIG. 23.

Next, the configuration of the die feed section 1 will be explained with reference to FIG. 25. FIG. 25 is a schematic cross-sectional view showing the main portion of the die feed section shown in FIG. 23.

The die feed section 1 includes: the wafer hold stage 12 that moves in the horizontal plane (XY plane); and the peeling-off unit 13 that moves up and down. The wafer hold stage 12 includes: an expand ring 15 that holds a wafer ring 14; and a support ring 17 that horizontally positions a dicing tape 16 that is held by the wafer ring 14 and to which plural dice D are bonded. The peeling-off unit 13 is disposed inside of the support ring 17.

When a die D is pushed up, the die feed section 1 brings down the expand ring 15 that supports the wafer ring 14. As a result, the dicing tape 16 supported by the wafer ring 14 is stretched, spaces among dice D are expanded, and the die D is peeled off from the dicing tape 16 by the peeling-off unit 13, which improves die D pickup performance. Now, a bonding agent for bonding a die to a substrate has changed from a liquid agent to a film agent, and a film-shaped bonding material called a die attach film (DAF) 18 is attached to the wafer 11 and the dicing tape 16 in such a way that the film-shaped bonding material is sandwiched in between the wafer 11 and the dicing tape 16. If a wafer 11 includes the die attach film 18, dicing is executed on both wafer 11 and the die attach film 18. Therefore, in the step of peeling-off, the wafer 11 and the die attach film 18 are peeled off from the dicing tape 16.

Figure 26:
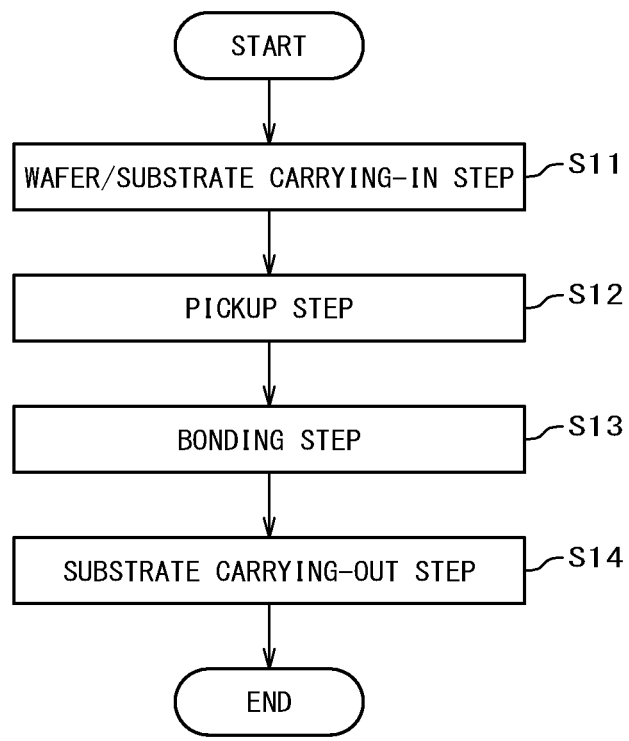
FIG. 26 is a flowchart showing a manufacturing method for a semiconductor device using the die bonder shown in FIG. 23.

Next, a manufacturing method for a semiconductor device using the die bonder according to the first example will be explained with reference to FIG. 26. FIG. 26 is a flowchart showing a manufacturing method for a semiconductor device using the die bonder shown in FIG. 23.

(Wafer/Substrate Carrying-In Step: Step S11)

The wafer ring 14 that holds the dicing tape 16, to which dice D separated from the wafer 11 are attached, is stored in a wafer cassette (not shown), and the wafer cassette is carried in the die bonder 10. The control device 8 brings out a wafer ring 14 from the wafer cassette in which wafer rings 14 are filled up, and feeds the wafer ring 14 to the die feed section 1. In addition, the control device 8 prepares a substrate S and carries the substrate S in the die bonder 10. Furthermore, the control device 8 loads the substrate S on the substrate feed section 6 using the pair of the substrate transfer claws 51.

(Pickup Step: Step S12)

As mentioned above, the control device 8 peels off a die D, and picks up the peeled-off die from the wafer 11. In such a way, the die D peeled off from the dicing tape 16 together with a piece of the die attach film 18 is sucked and held by the collet 22 and transferred to the next step (Step S13). Then the collet 22 that has transferred the die D to the next step returns to the die feed section 1, and the next die D is peeled off from the dicing tape 16 according to the above-mentioned procedure. Successively, other dice D are peeled off from the dicing tape 16 one by one according to the same procedure.

(Bonding Step: Step S13)

The control device 8 mounts the picked-up die on the substrate S or laminates the picked-up die D on a die bonded already. The control device 8 mounts the die D picked-up from the wafer 11 on the intermediate stage 31, picks up the die D again from the intermediate stage 31 with the bonding head 41, and bonds the die D to the transferred substrate S.

(Substrate Carrying-Out Step: Step 14)

The control device 8 brings out the substrate S to which dice are bonded from the pair of the substrate transfer claws 51 in the substrate carrying-out section 7, and carried out the substrate S from the die bonder 10.

As described above, the dice D are mounted on the substrate S via pieces of the die attach film 18 respectively, and carried out from the die bonder. And then the dice D are electrically connected to the electrodes of the substrate S via Au wires respectively in the step of wire bonding. Successively, the substrate S on which the dice D are mounted is carried in the die bonder, and second dice D are respectively laminated on the dice D mounted on the substrate S via pieces of die attach film 18. After the substrate S on which the dice D and the second dice D are laminated is carried out from the die bonder, the dice D and the second dice D are electrically connected to the electrodes of the substrate S via Au wires respectively in the step of wire bonding. After being peeled off from dicing tape 16 in the abovementioned way, the second dice D are transferred to the step of pellet bonding, and are laminated on the already-bonded dice D respectively. After the above steps are repeated predefined times, the substrate S is transferred to a mold process, and plural dice D and Au wires are sealed by mold resin (not shown), so that laminated packages are completed.

SECOND EXAMPLE

Figure 27:
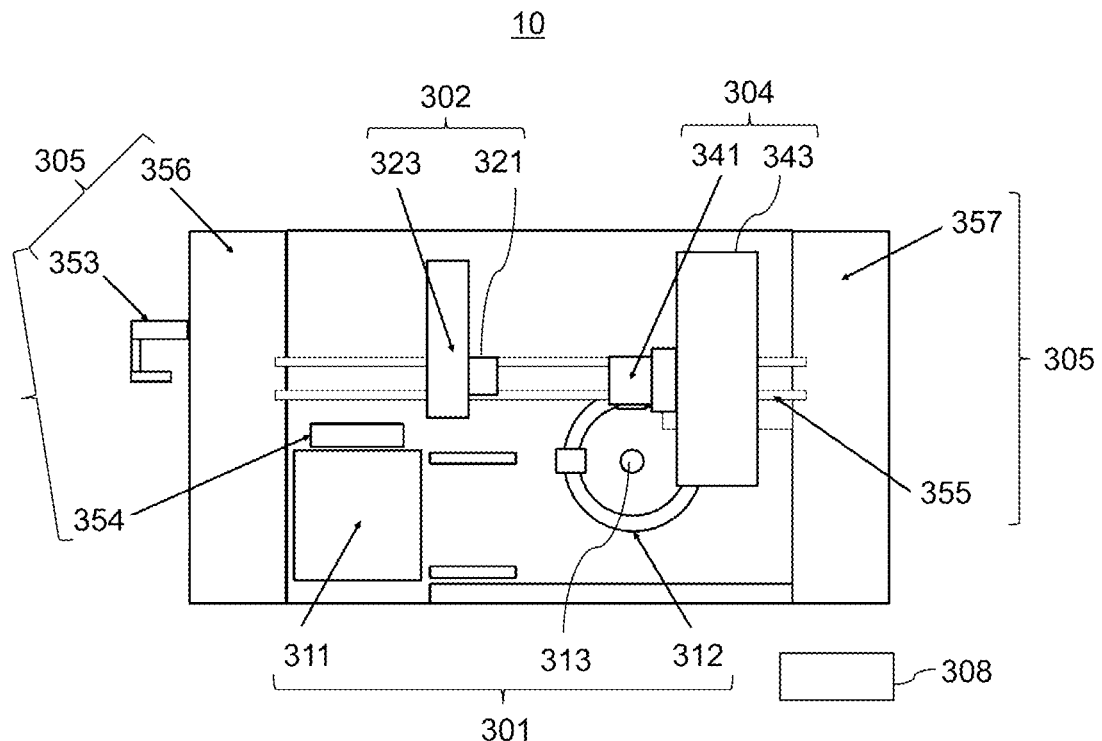
FIG. 27 is a top view showing the outline of a die bonder according to a second example.

FIG. 27 is a top view showing the outline of a die bonder according to a second example.

Schematically describing, the die bonder 10 according to the second example includes: a wafer feed section 301; a work feed/transfer section 305; a preform section 302; a die bonding section 304; and a control device 308 that monitors and controls the operations of the respective sections.

The wafer feed section 301 includes a wafer cassette lifter 311 and a wafer ring holder 312. The work feed/transfer section 305 includes: a frame pusher 353; a loader lifter 354; a frame feeder 355; loader 356; and an unloader 357. The die bonding section 304 includes a bonding head 341 and a bonding table 343. The preform section 302 includes a preform head 321 and a preform table 323.

The control device 8 sets, in the wafer cassette lifter 311, a wafer cassette in which wafer rings 14 are filled up, and feeds a wafer ring 14 to the wafer ring holder 312. In parallel with the above operation, the preform section 302 applies a die adhesive agent to a work fed from the frame pusher 353 or loader lifter 354 of the loader 356 or cleans the work, and the work is transferred on the frame feeder 355 to a bonding point.

In the wafer ring holder 312, as is the case with the first example, a dicing tape (not shown) is stretched downward (expanded), spaces among dice D are expanded, so that die D pickup performance is improved. Subsequently, the die D is pushed up from under the die D itself by a push-up section 313 via the dicing tape, picked up by the bonding head 341, and the die D is bonded to a work (not shown) such as a lead frame. The wafer ring holder 312 is disposed on an XY linear motion table, and after the die is picked up, the wafer ring holder 312 moves to the position of the next die in a linear motion, and the above die bonding operation is repeated.

The bonding head 341 is installed at the bonding table 343. The bonding table 343 is any one of the tables according to the embodiment and the first modification to the fourth modification or a combination of some of those tables. It is conceivable that each of the preform table 323 for driving the preform head 321, an XY table for driving the wafer ring holder 312, and an XY table for driving the push-up section 313 is any one of the tables according to the embodiment and the first modification to the fourth modification or a combination of some of those tables.

In the above descriptions, although the disclosure achieved by the present disclosers has been explained concretely on the basis of the embodiment, the modifications, and the examples, this disclosure is not limited to the above-described embodiment, modifications, and examples, and it goes without saying that various kinds of alternations can be made to the above-described embodiment, modifications, and examples.

For example, although the descriptions have been made about the table that moves the driven body in the horizontal plane as an example in the embodiment, it is conceivable that this disclosure is applied to a table that moves the driven body up and down.

Although the bonding head has been explained in the embodiment as an example of the driven body, an optical unit used for the die bonding mechanism such as the substrate recognition camera according to the first example can be taken as an example of the driven body.

Although the method for suppressing vibrations using the measured acceleration has been explained in the first modification, it is also conceivable that the vibration suppression in the apparatus is achieved by feeding back the vibration of a table or the like, which is picked up using a sensor for sensing vibrations, in another unit. In other words, the vibration that occurs when the other unit is operating is picked up using the sensor for sensing vibrations, the picked-up vibration is converted into a vibration having an opposite phase, and an instruction based on the vibration having the opposite phase is sent to the second mover 106 that moves the stator 104 that acts as a counter, so that the vibration in the apparatus is suppressed. For example, three similar mechanisms are prepared for the X, Y, and Z axes, and the stator of an axis that is not brought into movement in reality is brought into movement so that a composite waveform composed of accelerations calculated using a three-dimensional acceleration sensor or a linear sensor is canceled to suppress the vibration. In this case, it is necessary that the stator should be brought into movement so that the position of the first mover of the axis that is not brought into movement in reality is kept intact.

In addition, it is conceivable that the Y axis drive section 43 is composed of one or a combination of some of the tables according to the embodiment and the first modification to the sixth modification.

Furthermore, in the first example, although the die bonder in which a die is picked up from the die feed section by the pickup head and mounted on the intermediate stage, and the die mounted on the intermediate stage is bonded to a substrate by the bonding head has been explained, the table according to the embodiment can be applied to a flip chip bonder in which a die pickup head that picks up a die from a die feed section is rotated upward to transfer the die to a transfer head or a bonding head, and the die is bonded to a substrate by the bonding head.

What is claimed is:
1. A die bonding apparatus comprising:
a driven body; and
a table for driving the driven body,
the table including:
a base;
a linear motor having a first mover that moves the driven body, and a stator;

a first linear motion guide that is provided between the base and the stator and capable of freely moving the stator;

a second linear motion guide that is provided between the base and the first mover and capable of freely moving the first mover;

a second mover provided in the form of being fixed to the base; and a control device for controlling the first mover and the second mover, wherein the control device is configured to suppress the vibration of the driven body during the time of the operation of the driven body by moving the first mover in a first direction along the second linear motion guide and, at the same time, by moving the stator in a second direction, which is a direction opposite to the first direction, along the first linear motion guide using the second mover.

2. The die bonding apparatus according to claim 1, further comprising a first linear sensor for detecting a position of the first mover, wherein the control device is configured to perform position control or speed control of the first mover, or transfer control of the first mover for transferring the first mover to a target position on the basis of an output of the first linear sensor.

3. The die bonding apparatus according to claim 2, further comprising a second linear sensor for detecting a position of the stator, wherein the control device is configured to perform position control or speed control of the stator, or transfer control of the stator for transferring the stator to a target position on the basis of an output of the second linear sensor.

4. The die bonding apparatus according to claim 1, further comprising:

a first linear sensor for detecting a position of the first mover relative to the stator; and a second linear sensor for detecting a position of the stator relative to the base, wherein the control device is configured to perform position control or speed control of the first mover, or transfer control of the first mover for transferring the first mover to a target position on the basis of the outputs of the first linear sensor and the second linear sensor.

5. The die bonding apparatus according to claim 1, wherein the control device is configured to broaden a movable range of the first mover in a first direction by moving the stator in the first direction along the first linear motion guide using the second mover.

6. The die bonding apparatus according to claim 1, wherein the stator includes a plurality of permanent magnets and a yoke for combining magnetic fluxes of a plurality of combinations of neighboring permanent magnets among the plurality of permanent magnets, the first mover is disposed above the stator, and includes a first coil section composing an electromagnet and a support member that is disposed on the second linear motion guide and supports the first coil section, and the second mover is disposed above the stator, and includes a second coil section composing an electromagnet and a support member that is disposed on the base and supports the second coil section.

7. The die bonding apparatus according to claim 1, wherein the control device is configured to move the stator by controlling the second mover on the basis of a waveform having a phase opposite to a phase of an acceleration time waveform of the first mover at the time when the control device accelerates or deaccelerates the first mover.

8. The die bonding apparatus according to claim 7, wherein the control device is configured to perform control of the first mover and control of the second mover independently of each other via a network, and move the second mover in parallel with movement of the first mover and in the same direction as the direction of the movement of the first mover.

9. The die bonding apparatus according to claim 8, wherein the driven body includes an acceleration sensor on its tip, and the control device is configured to measure a waveform of a swingback that occurs in association with an acceleration using the acceleration sensor when the control device accelerates or deaccelerates the first mover, and at the same time, the control device is configured to reflect the waveform of the swingback in a standard acceleration waveform used for making the stator move using the second mover.

10. The die bonding apparatus according to claim 1, wherein the control device is configured to make the second mover give a thrust force to the stator in such a way that a position of the center of gravity of a combination of the first mover and the stator during the movement of the first mover always becomes the same as that of the combination of the first mover and the stator before the first mover starts moving.

11. The die bonding apparatus according to claim 1, further comprising:

another table, which is different from the abovementioned table; and a sensor for detecting a vibration of the other table, wherein the control device is configured to make the second mover move the stator on the basis of the detected vibration.

12. The die bonding apparatus according to claim 1, further comprising balancers or dampers that absorb an up-and-down vibration and that are fixed under both ends of the first linear motion guide.

13. The die bonding apparatus according to claim 1, wherein the stator includes a plurality of permanent magnets and a yoke for combining the magnetic fluxes of a plurality of combinations of neighboring permanent magnets among the plurality of permanent magnets, and some of the plurality of permanent magnets are disposed more densely on a portion of the stator overlapping the second mover in a top view than on a remaining portion of the stator.

14. A die bonding apparatus comprising:

a driven body; and a table for driving the driven body, the table including:

a base;

a linear motor having a first mover that moves the driven body, and a stator;

a first linear motion guide that is provided between the base and the stator and capable of freely moving the stator;

a second mover;

a second linear motion guide that is prepared between the base and the first mover/the second mover and that moves the first mover and the second mover;

a first fixing section that fixes or releases the stator;

a second fixing section that fixes or releases the second mover; and a control device that controls the first mover, the second mover, the first fixing section, and the second fixing section.

15. The die bonding apparatus according to claim 14, wherein the control device is configured to suppress a vibration of the driven body during the time of an operation of the driven body by:

making the stator movable using the first fixing section, and at the same time, by fixing the second mover using the second fixing section; and moving the first mover in a first direction along the second linear motion guide and, at the same time, by moving the stator in a second direction, which is a direction opposite to the first direction, along the first linear motion guide using the second mover.

16. The die bonding apparatus according to claim 14, wherein the control device is configured to suppress a vibration of the driven body during the time of an operation of the driven body by:

fixing the stator using the first fixing section, and at the same time, by making the second mover movable using the second fixing section; and moving the first mover in a first direction along the second linear motion guide and, at the same time, by moving the second mover in a second direction, which is a direction opposite to the first direction, along the second linear motion guide.

17. The die bonding apparatus according to claim 14, wherein the control device is configured to broaden the movable range of the first mover in a first direction by:

fixing the stator using the first fixing section, and at the same time, by making the second mover movable using the second fixing section, and by moving the second mover a predefined distance in the first direction along the second linear motion guide; and making the stator movable using the first fixing section, and at the same time, by fixing the second mover using the second fixing section, and by moving the stator in a second direction, which is a direction opposite to the first direction, along the first linear motion guide using the second mover.

18. The die bonding apparatus according to claim 14, wherein the stator includes a plurality of permanent magnets and a yoke for combining the magnetic fluxes of a plurality of combinations of neighboring permanent magnets among the plurality of permanent magnets, and each of the first mover and the second mover is disposed above the stator, and includes a coil section composing an electromagnet and a support member that is disposed on the second linear motion guide and supports the coil section, the first fixing section is disposed near to the stator and composed of an electromagnet, and the second fixing section is an electromagnet installed at the support member of the second mover.

19. A manufacturing method for a semiconductor device comprising:

a substrate carrying-in step of carrying a substrate in a die bonding apparatus including a bonding head, a table for driving the bonding head, a base; a linear motor having a first mover that moves the bonding head in a horizontal plane and a stator; a first linear motion guide that is provided between the base and the stator and capable of freely moving the stator; a second linear motion guide that is provided between the base and the first mover and capable of freely moving the first mover; and a second mover prepared in the form of being fixed to the base; and a bonding step of picking up a die and bonding the die to the substrate, wherein the bonding step is a step in which the first mover is moved in a first direction along the second linear motion guide and, at the same time, the stator is moved in a second direction, which is a direction opposite to the first direction, along the first linear motion guide using the second mover.

* * * * *